United States Patent
Oh et al.

(10) Patent No.: US 11,901,356 B2
(45) Date of Patent: Feb. 13, 2024

(54) THREE-DIMENSIONAL SEMICONDUCTOR DEVICES

(71) Applicant: SAMSUNG ELECTRONICS CO., LTD., Suwon-si (KR)

(72) Inventors: Seungha Oh, Seoul (KR); Pil-Kyu Kang, Hwaseong-si (KR); Kughwan Kim, Hwaseong-si (KR); Weonhong Kim, Suwon-si (KR); Yuichiro Sasaki, Seoul (KR); Sang Woo Lee, Seoul (KR); Sungkeun Lim, Uiwang-si (KR); Yongho Ha, Hwaseong-si (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/817,069

(22) Filed: Mar. 12, 2020

(65) Prior Publication Data

US 2021/0020628 A1    Jan. 21, 2021

(30) Foreign Application Priority Data

Jul. 19, 2019   (KR) .................. 10-2019-0087351

(51) Int. Cl.
| | |
|---|---|
| *H01L 27/06* | (2006.01) |
| *H01L 23/48* | (2006.01) |
| *H10B 41/60* | (2023.01) |
| *H10B 43/20* | (2023.01) |
| *H10B 63/00* | (2023.01) |

(52) U.S. Cl.
CPC ........ *H01L 27/0688* (2013.01); *H01L 23/481* (2013.01); *H10B 41/60* (2023.02); *H10B 43/20* (2023.02); *H10B 63/30* (2023.02); *H10B 63/84* (2023.02)

(58) Field of Classification Search
CPC ........... H01L 27/0688; H01L 27/11558; H01L 27/11578; H01L 27/2436; H01L 27/2481; H01L 23/481
See application file for complete search history.

(56) References Cited

U.S. PATENT DOCUMENTS

| | | | |
|---|---|---|---|
| 6,730,588 B1 | 5/2004 | Schinella | |
| 7,378,309 B2 | 5/2008 | Lee et al. | |
| 7,557,411 B2 | 7/2009 | Noguchi et al. | |
| 7,589,380 B2 | 9/2009 | Rafferty et al. | |

(Continued)

*Primary Examiner* — Shaun M Campbell
(74) *Attorney, Agent, or Firm* — F. Chau & Associates, LLC

(57) ABSTRACT

A three-dimensional semiconductor device includes a lower substrate, a plurality of lower transistors disposed on the lower substrate, an upper substrate disposed on the lower transistors, a plurality of lower conductive lines disposed between the lower transistors and the upper substrate, and a plurality of upper transistors disposed on the upper substrate. At least one of the lower transistors is connected to a corresponding one of the lower conductive lines. Each of the upper transistors includes an upper gate electrode disposed on the upper substrate, a first upper source/drain pattern disposed in the upper substrate at a first side of the upper gate electrode, and a second upper source/drain pattern disposed in the upper substrate at a second, opposing side of the upper gate electrode. The upper gate electrode includes silicon germanium (SiGe).

16 Claims, 13 Drawing Sheets

(56) References Cited

U.S. PATENT DOCUMENTS

| | | |
|---|---|---|
| 7,666,775 B2 | 2/2010 | Chan et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,613,887 B2 * | 4/2017 | Sekar ............... H01L 27/092 |
| 10,096,641 B2 | 10/2018 | Ikeda et al. |
| 2006/0138518 A1 | 6/2006 | Mutou et al. |
| 2006/0270215 A1 | 11/2006 | Lee et al. |
| 2007/0215918 A1 * | 9/2007 | Ito ............... H01L 21/823814 |
| | | 257/288 |
| 2011/0186936 A1 * | 8/2011 | Iwamatsu ......... H01L 21/76898 |
| | | 257/393 |
| 2011/0233648 A1 | 9/2011 | Seol et al. |
| 2012/0248622 A1 * | 10/2012 | Sadaka ............... H01L 24/80 |
| | | 257/774 |
| 2016/0111369 A1 * | 4/2016 | Or-Bach ............... H10B 43/35 |
| | | 257/757 |
| 2017/0243650 A1 * | 8/2017 | Ogawa ............ H01L 27/11556 |
| 2019/0006222 A1 * | 1/2019 | Or-Bach ............ H01L 21/6835 |
| 2020/0312862 A1 * | 10/2020 | Hwang ............ H01L 27/11582 |

* cited by examiner

THREE-DIMENSIONAL SEMICONDUCTOR DEVICES

CROSS-REFERENCE TO RELATED APPLICATIONS

This application claims priority under 35 U.S.C. § 119 to Korean Patent Application No. 10-2019-0087351, filed on Jul. 19, 2019 in the Korean Intellectual Property Office, the entire disclosure of which is hereby incorporated by reference in its entirety.

TECHNICAL FIELD

Exemplary embodiments of the present inventive concept relate to a semiconductor device, and more particularly, to a three-dimensional semiconductor device including a monolithically integrated three-dimensional circuit.

DISCUSSION OF THE RELATED ART

Higher integration of semiconductor devices allows consumer demands for improved performance and inexpensive prices to be satisfied, since in semiconductor devices, increased integration is an important factor in determining product performance and prices.

In the case of two-dimensional or planar semiconductor devices, since their integration is mainly determined by the area occupied by a unit memory cell, integration is greatly influenced by the level of a fine pattern forming technology. However, since extremely expensive equipment is needed to reduce a feature size of patterns, although an integration density of a two-dimensional semiconductor device is increasing, there is still room for improvement.

To overcome such a limitation, a three-dimensional semiconductor device including a monolithically integrated three-dimensional circuit has recently been proposed.

SUMMARY

An exemplary embodiment of the inventive concept provides a three-dimensional semiconductor device with excellent characteristics.

An exemplary embodiment of the inventive concept provides a three-dimensional semiconductor device that can be easily fabricated.

According to an exemplary embodiment of the inventive concept, a three-dimensional semiconductor device includes a lower substrate, a plurality of lower transistors disposed on the lower substrate, an upper substrate disposed on the lower transistors, a plurality of lower conductive lines disposed between the lower transistors and the upper substrate, and a plurality of upper transistors disposed on the upper substrate. At least one of the lower transistors is connected to a corresponding one of the lower conductive lines. Each of the upper transistors includes an upper gate electrode disposed on the upper substrate, a first upper source/drain pattern disposed on the upper substrate at a first side of the upper gate electrode, and a second upper source/drain pattern disposed on the upper substrate at a second, opposing side of the upper gate electrode. The upper gate electrode includes silicon germanium (SiGe).

According to an exemplary embodiment of the inventive concept, a three-dimensional semiconductor device includes a lower substrate, a plurality of lower transistors disposed on the lower substrate, an upper substrate disposed on the lower transistors, and a plurality of upper transistors disposed on the upper substrate. Each of the upper transistors includes an upper gate electrode disposed on the upper substrate, a first upper source/drain pattern disposed in the upper substrate at a first side of the upper gate electrode, and a second upper source/drain pattern disposed in the upper substrate at a second, opposing side of the upper gate electrode. The upper gate electrode includes a silicon germanium (SiGe) layer that is doped with dopants. A concentration of the dopant in the upper gate electrode is smaller than a concentration of germanium (Ge) in the upper gate electrode.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
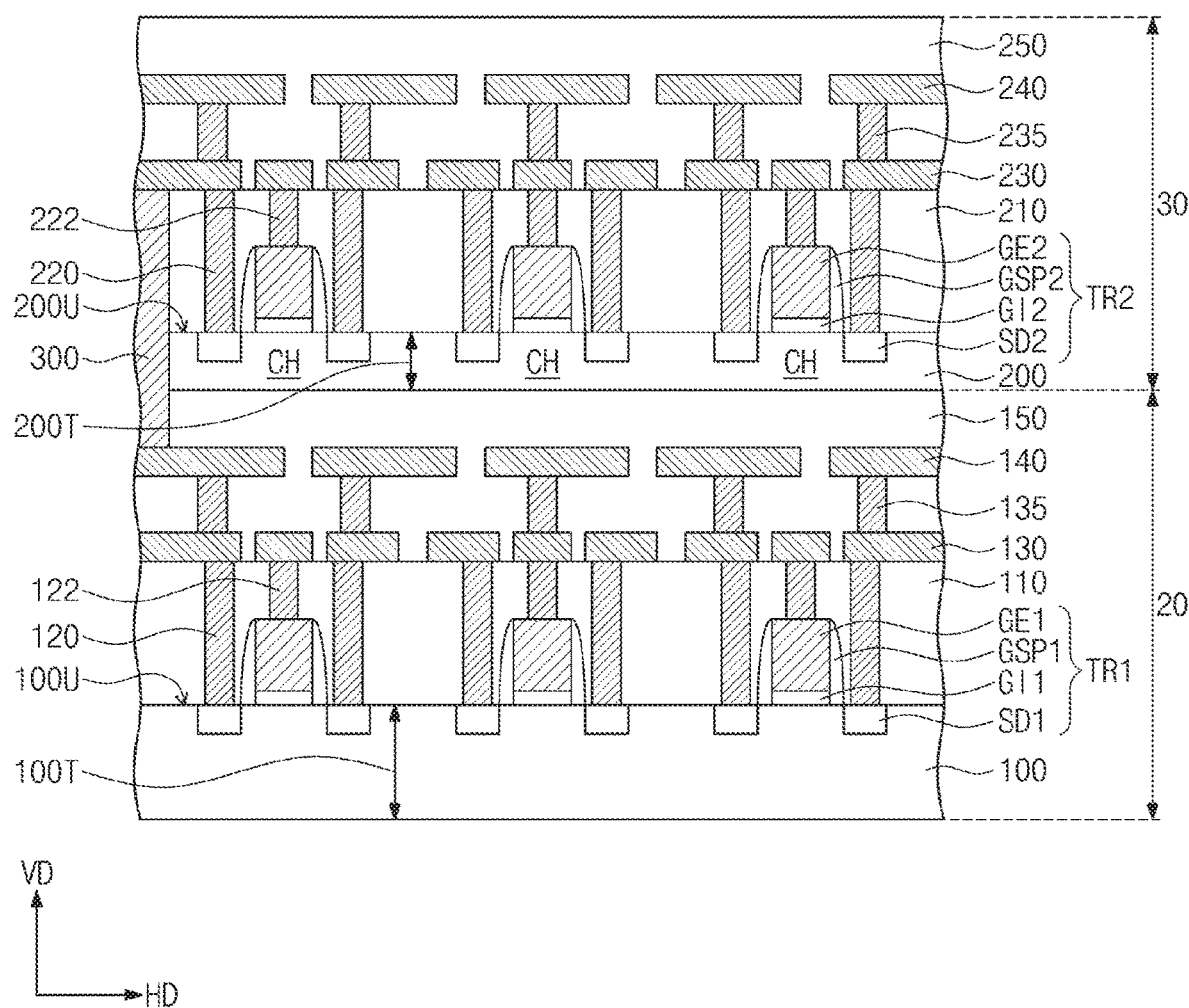
FIG. 1 is a cross-sectional view illustrating a three-dimensional semiconductor device according to an exemplary embodiment of the inventive concept.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "interposed between" two components, it can be the only component interposed between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a cross-sectional view illustrating a three-dimensional semiconductor device according to an exemplary embodiment of the inventive concept.

Referring to FIG. 1, a three-dimensional semiconductor device 10 may include a lower circuit layer 20 and an upper circuit layer 30, which is stacked on the lower circuit layer 20.

The lower circuit layer 20 may include a lower substrate 100 and lower transistors TR1 disposed on the lower substrate 100. The lower substrate 100 may be a semiconductor substrate (e.g., a silicon wafer doped with p-type or n-type dopants). The lower transistors TR1 may be disposed on a top surface 100U of the lower substrate 100 and may constitute one or more electronic circuit. For example, the lower transistors TR1 may constitute a memory circuit (e.g., a DRAM circuit, an SRAM circuit, or a FLASH memory circuit) or a logic circuit. The logic circuit may be configured to serve as a circuit (e.g., an INVERTER, an AND gate, an OR gate, a NAND gate, or a NOR gate) having a Boolean logic function or a circuit (e.g., a FLIP-FLOP) having a storage function.

Each of the lower transistors TR1 may include a lower gate electrode GE1 disposed on the lower substrate 100, a lower gate insulating pattern GI1 disposed between the lower substrate 100 and the lower gate electrode GE1, lower gate spacers GSP1 disposed on side surfaces of the lower gate electrode GE1, and lower source/drain patterns SD1 disposed at both sides of the lower gate electrode GE1. For example, a first lower gate spacer GSP1 may be disposed on a first side surface of the lower gate electrode GE1, and a second lower gate spacer GSP1 may be disposed on a second, opposing side surface of the lower gate electrode GE1. For example, a first lower source/drain pattern SD1 may be disposed in the lower substrate 100 at a first side of the lower gate electrode GE1, and a second lower source/drain pattern SD1 may be disposed in the lower substrate 100 at a second, opposing side of the lower gate electrode GE1. The lower source/drain patterns SD1 may be disposed in the lower substrate 100 and may be spaced apart from each other in a horizontal direction HD extending parallel to the top surface 100U of the lower substrate 100. For example, the lower source/drain patterns SD1 may be embedded within the lower substrate 100.

The lower gate electrode GE1 may be formed of or include at least one of a doped semiconductor, conductive metal nitrides, or metals. For example, the lower gate electrode GE1 may include at least one of polycrystalline silicon (Si), polycrystalline silicon germanium (SiGe), or polycrystalline germanium (Ge) and, in an exemplary embodiment, may further include dopants. The dopants may include, for example, at least one of boron (B), arsenic (As), phosphorus (P), antimony (Sb), aluminum (Al), or gallium (Ga). The lower gate insulating pattern GI1 may be formed of or include at least one of, for example, silicon oxide, silicon nitride, silicon oxynitride, or high-k dielectric materials. Here, the high-k dielectric materials may include materials (e.g., hafnium oxide (HfO), aluminum oxide (AlO), or tantalum oxide (TaO)) whose dielectric constants are higher than that of silicon oxide. The lower gate spacers GSP1 may be formed of or include at least one of, for example, silicon oxide, silicon nitride, or silicon oxynitride.

In an exemplary embodiment, the lower source/drain patterns SD1 may be impurity regions, which are formed by injecting p-type or n-type dopants into the lower substrate 100. Thus, the lower source/drain patterns SD1 may be embedded within the lower substrate 100. In exemplary embodiments, the lower source/drain patterns SD1 may be epitaxial patterns, which are formed using the lower substrate 100 as a seed layer. In this case, the lower source/drain patterns SD1 may be formed of or include at least one of, for example, silicon germanium (SiGe), silicon (Si), or silicon carbide (SiC), and may further include p-type or n-type dopants. The lower source/drain patterns SD1 may have a different conductivity type from the lower substrate 100.

The lower circuit layer 20 may include a first lower interlayer insulating layer 110 covering the lower transistors TR1. The first lower interlayer insulating layer 110 may be formed of or include at least one of, for example, silicon oxide, silicon nitride, silicon oxynitride, or low-k dielectric materials.

The lower circuit layer 20 may include lower source/drain contacts 120 and lower gate contacts 122, which are disposed in the first lower interlayer insulating layer 110. The lower source/drain patterns SD1 of each of the lower transistors TR1 may be respectively connected to corresponding ones of the lower source/drain contacts 120, and the lower gate electrode GE1 of each of the lower transistors TR1 may be connected to a corresponding one of the lower gate contacts 122. The lower source/drain contacts 120 and the lower gate contacts 122 may be formed of or include, for example, metal nitrides (e.g., TiN, WN, and TaN) and/or metals (e.g., Ti, W, and Ta).

The lower circuit layer 20 may include first lower conductive lines 130, second lower conductive lines 140, and lower conductive contacts 135, which are disposed on the first lower interlayer insulating layer 110. The second lower conductive lines 140 may be spaced apart from the first lower conductive lines 130 in a vertical direction VD extending perpendicular to the top surface 100U of the lower substrate 100. For example, the vertical direction VD may cross the horizontal direction HD. The second lower conductive lines 140 may be positioned at a level higher than the first lower conductive lines 130. In the present specification, the term "level" denotes a height measured from the top surface 100U of the lower substrate 100. The lower conductive contacts 135 may be disposed between the first lower conductive lines 130 and the second lower conductive lines 140. Each of the lower conductive contacts 135 may connect a corresponding one of the first lower conductive lines 130 to a corresponding one of the second lower conductive lines 140. Each of the lower source/drain contacts 120 and the lower gate contacts 122 may be connected to a corresponding one of the first lower conductive lines 130. Thus, the lower transistors TR1 may be connected to a corresponding one of the first and second lower conductive lines 130 and 140. The first lower conductive lines 130, the second lower conductive lines 140, and the lower conductive contacts 135 may be formed of or include at least one of, for example, metals (e.g., copper (Cu), ruthenium (Ru), molybdenum (Mo), tungsten (W), cobalt (Co), etc.) and/or conductive metal nitrides (e.g., titanium nitride (TiN), tantalum nitride (TaN), tantalum carbide (TaC), tungsten carbonitride (WCN), etc.).

The lower circuit layer 20 may include a second lower interlayer insulating layer 150 disposed on the first lower interlayer insulating layer 110. The second lower interlayer insulating layer 150 may cover the first lower conductive lines 130, the second lower conductive lines 140, and the lower conductive contacts 135. The second lower interlayer insulating layer 150 may be formed of or include at least one of, for example, silicon oxide, silicon nitride, silicon oxynitride, or low-k dielectric materials.

The upper circuit layer 30 may be stacked on the lower circuit layer 20 in the vertical direction VD. The upper circuit layer 30 may include an upper substrate 200 and upper transistors TR2 disposed on the upper substrate 200. The upper substrate 200 may be disposed on the second lower interlayer insulating layer 150 of the lower circuit layer 20. Each of the lower substrate 100 and the upper substrate 200 may have a thickness in the vertical direction VD. A thickness 200T of the upper substrate 200 may be smaller than a thickness 100T of the lower substrate 100. The upper substrate 200 may be a semiconductor substrate (e.g., a silicon wafer doped with p-type or n-type dopants). The upper transistors TR2 may be disposed on a top surface 200U of the upper substrate 200 and may constitute one or more electronic circuit. The upper transistors TR2 may constitute a memory circuit (e.g., a DRAM circuit, an SRAM circuit, or a FLASH memory circuit) or a logic circuit. The logic circuit may be configured to serve as a circuit (e.g., an INVERTER, an AND gate, an OR gate, a NAND gate, or a NOR gate) having a Boolean logic function or a circuit (e.g., a FLIP-FLOP) having a storage function.

Each of the upper transistors TR2 may include an upper gate electrode GE2 disposed on the upper substrate 200, an upper gate insulating pattern GI2 disposed between the upper substrate 200 and the upper gate electrode GE2, upper gate spacers GSP2 disposed on sides surfaces of the upper gate electrode GE2, and upper source/drain patterns SD2 disposed at both sides of the upper gate electrode GE2. For example, a first upper gate spacer GSP2 may be disposed on a first side surface of the upper gate electrode GE2, and a second upper gate spacer GSP2 may be disposed on a second, opposing side surface of the upper gate electrode GE2. For example, a first upper source/drain pattern SD2 may be disposed in the upper substrate 200 at a first side of the upper gate electrode GE2, and a second upper source/drain pattern SD2 may be disposed in the upper substrate 200 at a second, opposing side of the upper gate electrode GE2. The upper source/drain patterns SD2 may be disposed in the upper substrate 200 and may be spaced apart from each other in the horizontal direction HD. For example, the upper source/drain patterns SD2 may be embedded within the upper substrate 200.

The upper substrate 200 may include a channel region CH, which is vertically disposed below the upper gate electrode GE2 and is horizontally interposed between the upper source/drain patterns SD2. The channel region CH may be formed of or include, for example, silicon. The channel region CH may serve as a channel region of each of the upper transistors TR2.

The upper gate electrode GE2 may be formed of or include, for example, polycrystalline silicon germanium (SiGe). In an exemplary embodiment, a concentration of germanium (Ge) in the upper gate electrode GE2 may be greater than or equal to about 10 at % and may be smaller than about 100 at %. In a case in which the concentration of germanium (Ge) in the upper gate electrode GE2 is smaller than about 10 at %, in a process of depositing an upper gate electrode layer for forming the upper gate electrode GE2, it may be difficult to crystallize the upper gate electrode layer at a desired process temperature. The upper gate electrode GE2 may further include dopants. The dopants may include, for example, at least one of boron (B), arsenic (As), phosphorus (P), antimony (Sb), aluminum (Al), or gallium (Ga). A concentration of the dopants in the upper gate electrode GE2 may be smaller than the concentration of germanium (Ge) in the upper gate electrode GE2. As an example, the dopants may be boron (B), and a concentration of boron in the upper gate electrode GE2 may be smaller than or equal to about 10 at %. In an exemplary embodiment, the concentration of boron in the upper gate electrode GE2 may be greater than or equal to about $1*10^{20}$ ea/cm$^3$ and may be smaller than or equal to about $1*10^{22}$ ea/cm$^3$. In a case in which the concentration of boron in the upper gate electrode GE2 is greater than about 10 at %, in a process of depositing the upper gate electrode layer for forming the upper gate electrode GE2, it may be difficult to crystallize the upper gate electrode layer at a desired process temperature. The upper gate electrode GE2 may further include at least one of, for example, conductive metal nitrides and/or metals.

The upper gate insulating pattern GI2 may be formed of or include at least one of, for example, silicon oxide, silicon nitride, silicon oxynitride, or high-k dielectric materials. Here, the high-k dielectric materials may include materials (e.g., hafnium oxide (HfO), aluminum oxide (AlO), or tantalum oxide (TaO)) whose dielectric constants are higher than that of silicon oxide. The upper gate spacers GSP2 may be formed of or include at least one of, for example, silicon oxide, silicon nitride, or silicon oxynitride.

In an exemplary embodiment, the upper source/drain patterns SD2 may be impurity regions, which are formed by injecting p-type or n-type dopants into the upper substrate 200. Thus, the upper source/drain patterns SD2 may be embedded within the upper substrate 200. In exemplary embodiments, the upper source/drain patterns SD2 may be epitaxial patterns, which are formed using the upper substrate 200 as a seed layer. In this case, the upper source/drain patterns SD2 may be formed of or include at least one of, for example, silicon germanium (SiGe), silicon (Si), or silicon carbide (SiC), and may further include p-type or n-type dopants. The upper source/drain patterns SD2 may have a different conductivity type from the upper substrate 200.

The upper circuit layer 30 may include a first upper interlayer insulating layer 210 covering the upper transistors TR2. The first upper interlayer insulating layer 210 may be formed of or include at least one of, for example, silicon oxide, silicon nitride, silicon oxynitride, or low-k dielectric materials.

The upper circuit layer 30 may include upper source/drain contacts 220 and upper gate contacts 222, which are disposed in the first upper interlayer insulating layer 210. The upper source/drain patterns SD2 of each of the upper transistors TR2 may be respectively connected to corresponding ones of the upper source/drain contacts 220, and the upper gate electrode GE2 of each of the upper transistors TR2 may be connected to a corresponding one of the upper gate contacts 222. The upper source/drain contacts 220 and the upper gate contacts 222 may be formed of or include metal nitrides (e.g., TiN, WN, and TaN) and/or metals (e.g., Ti, W, and Ta).

The upper circuit layer 30 may include first upper conductive lines 230, second upper conductive lines 240, and upper conductive contacts 235, which are disposed on the first upper interlayer insulating layer 210. The second upper conductive lines 240 may be spaced apart from the first upper conductive lines 230 in the vertical direction VD. The second upper conductive lines 240 may be positioned at a level higher than the first upper conductive lines 230. The upper conductive contacts 235 may be disposed between the first upper conductive lines 230 and the second upper conductive lines 240. Each of the upper conductive contacts 235 may connect a corresponding one of the first upper conductive lines 230 to a corresponding one of the second upper conductive lines 240. Each of the upper source/drain contacts 220 and the upper gate contacts 222 may be connected to a corresponding one of the first upper conductive lines 230. Thus, the upper transistors TR2 may be connected to a corresponding one of the first and second upper conductive lines 230 and 240. The first upper conductive lines 230, the second upper conductive lines 240, and the upper conductive contacts 235 may be formed of or include at least one of, for example, metals (e.g., copper (Cu), ruthenium (Ru), molybdenum (Mo), tungsten (W), cobalt (Co), etc.) and/or conductive metal nitrides (e.g., titanium nitride (TiN), tantalum nitride (TaN), tantalum carbide (TaC), tungsten carbonitride (WCN), etc.).

The upper circuit layer 30 may include a second upper interlayer insulating layer 250, which is disposed on the first upper interlayer insulating layer 210. The second upper interlayer insulating layer 250 may cover the first upper conductive lines 230, the second upper conductive lines 240, and the upper conductive contacts 235. The second upper interlayer insulating layer 250 may be formed of or include at least one of, for example, silicon oxide, silicon nitride, silicon oxynitride, or low-k dielectric materials.

The three-dimensional semiconductor device 10 may include an upper penetration via 300 electrically connecting the lower circuit layer 20 to the upper circuit layer 30. The upper penetration via 300 may also be referred to herein as an upper penetration electrode. As an example, the upper penetration via 300 may penetrate the upper substrate 200 and may be electrically disconnected from the upper substrate 200. At least one of the first and second lower conductive lines 130 and 140 of the lower circuit layer 20 may be connected to at least one of the first and second upper conductive lines 230 and 240 of the upper circuit layer 30 through the upper penetration via 300. As an example, at least one of the second lower conductive lines 140 may be connected to at least one of the first upper conductive lines 230 through the upper penetration via 300. In an exemplary embodiment, the upper penetration via 300 may be formed of or include at least one of, for example, conductive metal nitrides or metals (e.g., copper (Cu), ruthenium (Ru), molybdenum (Mo), tungsten (W), and cobalt (Co)).

Terminals (e.g., the lower gate electrode GE1 and the lower source/drain patterns SD1) of each of the lower transistors TR1 in the lower circuit layer 20 may be connected to corresponding ones of the first lower conductive lines 130, and a corresponding one(s) of the second lower conductive lines 140. Terminals (e.g., the upper gate electrode GE2 and the upper source/drain patterns SD2) of each of the upper transistors TR2 in the upper circuit layer 30 may be connected to corresponding ones of the first upper conductive lines 230 and a corresponding one(s) of the second upper conductive lines 240. One terminal (e.g., one of the lower source/drain patterns SD1) of at least one of the lower transistors TR1 may be electrically connected to one terminal (e.g., one of the upper source/drain patterns SD2) of at least one of the upper transistors TR2 through corresponding ones of the first and second lower conductive lines 130 and 140, the upper penetration via 300, and corresponding ones of the first and second upper conductive lines 230 and 240.

According to an exemplary embodiment of the inventive concept, the upper gate electrode GE2 of each of the upper transistors TR2 may be formed of or include, for example, polycrystalline silicon germanium (SiGe). In this case, a deposition process for forming the upper gate electrode GE2 may be performed at a relatively low temperature (e.g., about 450° C. or lower). Accordingly, in exemplary embodiments, the lower transistors TR1, the first and second lower conductive lines 130 and 140, and the contacts 120, 122, and 135 in the lower circuit layer 20 may be prevented from being deteriorated during the formation of the upper gate electrode GE2. Furthermore, the upper gate electrode GE2 may further include dopants. In this case, by controlling the concentrations of germanium and dopant in the upper gate electrode GE2, in exemplary embodiments, a process temperature in the deposition process for forming the upper gate electrode GE2 and electric characteristics of the upper gate electrode GE2 may be adjusted. Accordingly, exemplary embodiments provide an improved process of fabricating a three-dimensional semiconductor device with improved characteristics.

Figure 2:
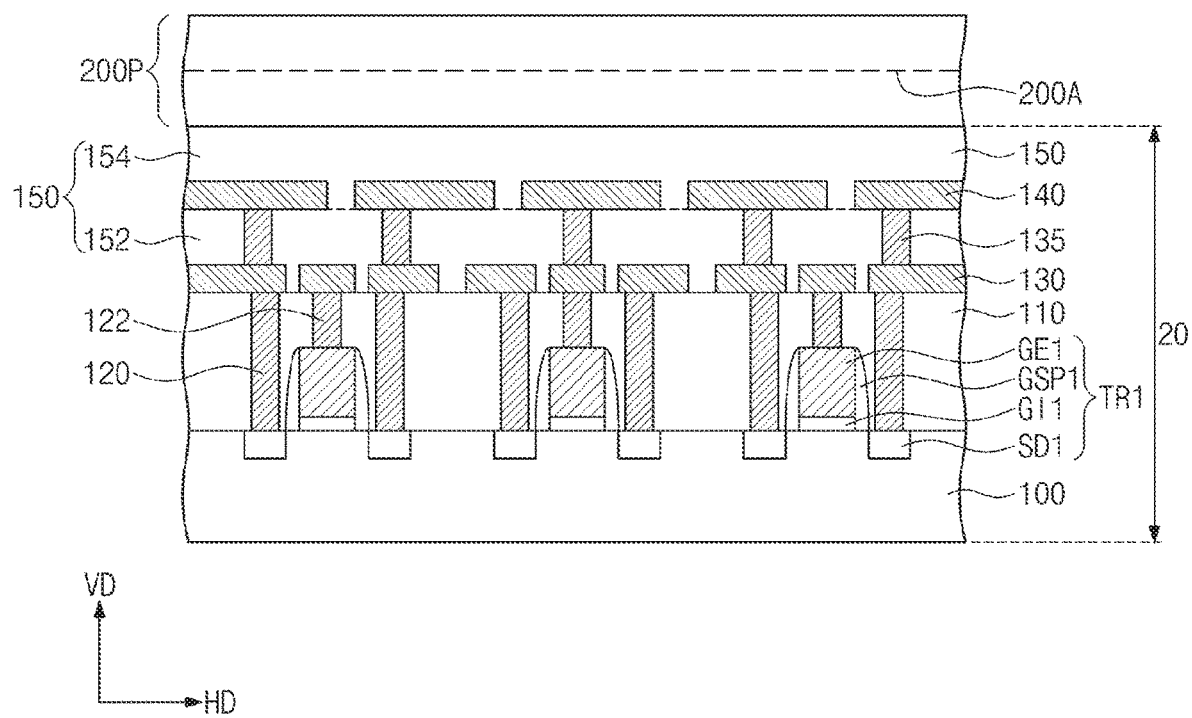
FIGS. 2 to 4 are cross-sectional views illustrating a method of fabricating a three-dimensional semiconductor device, according to an exemplary embodiment of the inventive concept.
Figure 3:
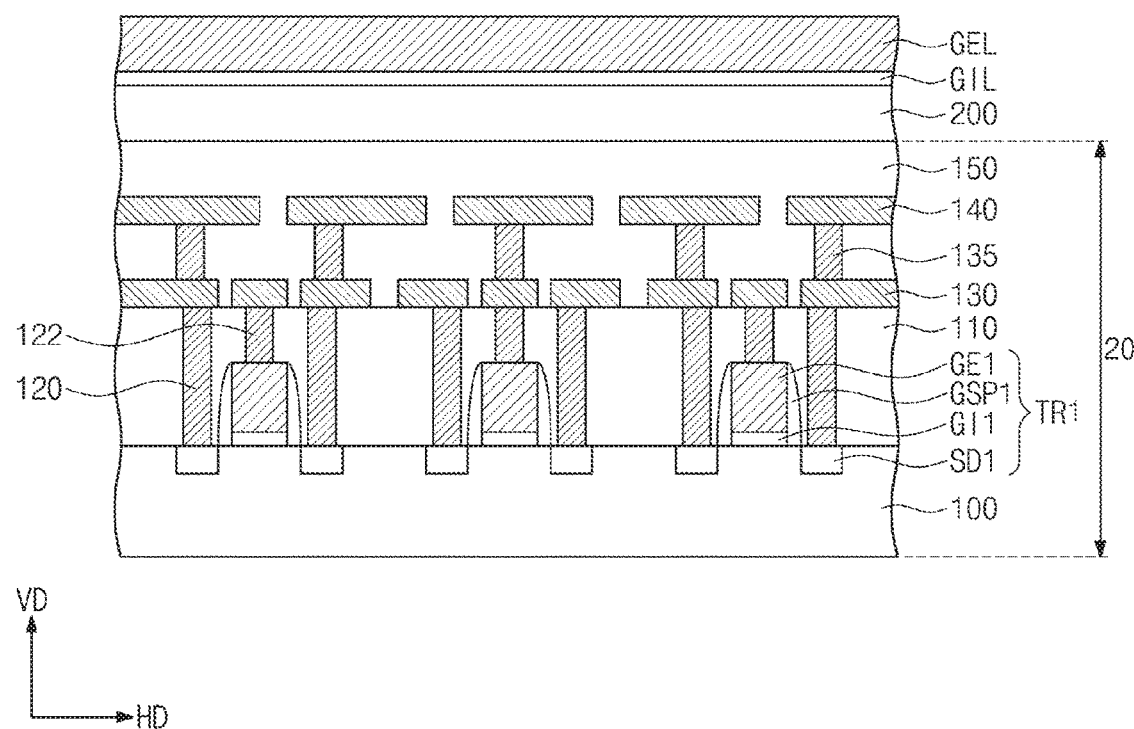
Figure 4:
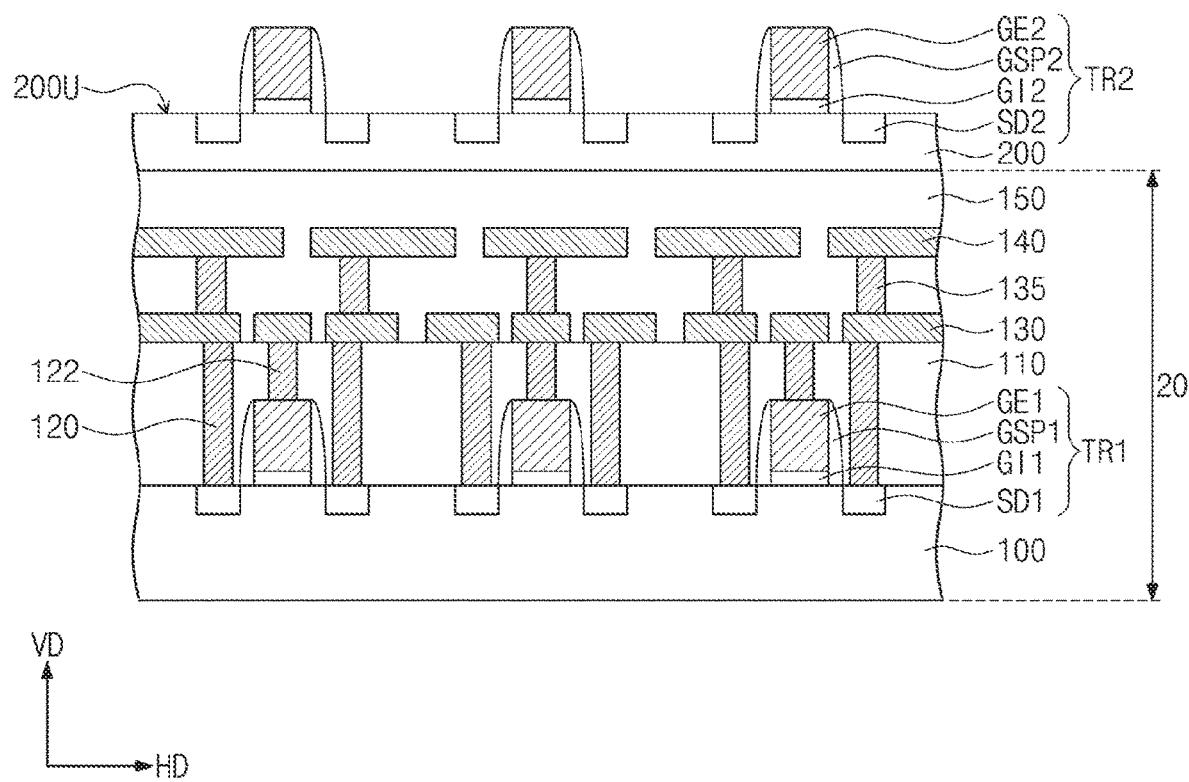

FIGS. 2 to 4 are cross-sectional views illustrating a method of fabricating a three-dimensional semiconductor device, according to an exemplary embodiment of the inventive concept. For convenience of explanation, elements previously described with reference to FIG. 1 may be identified by the same reference numerals, and a further description thereof may be omitted.

Referring to FIG. 2, the lower transistors TR1 may be formed on the lower substrate 100. The formation of the lower transistors TR1 may include forming the lower gate insulating pattern GI1 and the lower gate electrode GE1, which are sequentially stacked on the lower substrate 100, forming the lower gate spacers GSP1 on side surfaces of the lower gate electrode GE1, and forming the lower source/drain patterns SD1 in the lower substrate 100 at both sides of the lower gate electrode GE1. For example, a first lower gate spacer GSP1 may be formed on a first side surface of the lower gate electrode GE1, and a second lower gate spacer GSP1 may be formed on a second, opposing side surface of the lower gate electrode GE1. For example, a first lower source/drain pattern SD1 may be formed in the lower substrate 100 at a first side of the lower gate electrode GE1, and a second lower source/drain pattern SD1 may be formed in the lower substrate 100 at a second, opposing side of the lower gate electrode GE1. The formation of the lower gate insulating pattern GI1 and the lower gate electrode GE1 may include depositing a lower gate insulating layer on the lower substrate 100, depositing a lower gate electrode layer on the lower gate insulating layer, and sequentially patterning the lower gate electrode layer and the lower gate insulating layer. The formation of the lower gate spacers GSP1 may include forming a lower gate spacer layer on the lower substrate 100, on which the lower gate insulating pattern GI1 and the lower gate electrode GE1 are formed, and then anisotropically etching the lower gate spacer layer. The lower source/drain patterns SD1 may be formed, for example, by injecting p-type or n-type dopants into the lower substrate 100 or by performing a selective epitaxial growth process using the lower substrate 100 as a seed layer.

The first lower interlayer insulating layer 110 may be formed on the lower substrate 100 to cover the lower transistors TR1. The first lower interlayer insulating layer 110 may be formed by, for example, a chemical vapor deposition process.

The lower source/drain contacts 120 and the lower gate contacts 122 may be formed in the first lower interlayer insulating layer 110. In an exemplary embodiment, the formation of the lower source/drain contacts 120 and the lower gate contacts 122 may include forming lower source/drain contact holes and lower gate contact holes to penetrate the first lower interlayer insulating layer 110, forming a conductive layer on the first lower interlayer insulating layer 110 to fill the lower source/drain contact holes and the lower gate contact holes, and planarizing the conductive layer to expose the first lower interlayer insulating layer 110. The lower source/drain patterns SD1 of each of the lower transistors TR1 may be respectively connected to corresponding ones of the lower source/drain contacts 120, and the lower gate electrode GE1 of each of the lower transistors TR1 may be connected to a corresponding one of the lower gate contacts 122.

The first lower conductive lines 130 may be formed on the first lower interlayer insulating layer 110. As an example, the first lower conductive lines 130 may be formed by depositing a first lower conductive layer on the first lower interlayer insulating layer 110 and patterning the first lower conductive layer. A portion 152 of the second lower interlayer insulating layer 150 may be formed on the first lower interlayer insulating layer 110 to cover the first lower conductive lines 130. The lower conductive contacts 135 may be formed on the first lower conductive lines 130. In an exemplary embodiment, the formation of the lower conductive contacts 135 may include forming lower conductive contact holes to penetrate the portion 152 of the second lower interlayer insulating layer 150, forming a conductive layer to fill the lower conductive contact holes, and planarizing the conductive layer to expose the portion 152 of the second lower interlayer insulating layer 150. The second lower conductive lines 140 may be formed on the lower conductive contacts 135. The second lower conductive lines 140 may be formed by substantially the same method as that used to form the first lower conductive lines 130. A remaining portion 154 of the second lower interlayer insulating layer 150 may be formed to cover the second lower conductive lines 140. The second lower interlayer insulating layer 150 may be formed by, for example, a chemical vapor deposition process.

The lower substrate 100, the lower transistors TR1, the first and second lower conductive lines 130 and 140, the contacts 120, 122, and 135, and the first and second lower interlayer insulating layers 110 and 150 may constitute the lower circuit layer 20.

A preliminary upper substrate 200P may be disposed on the second lower interlayer insulating layer 150 of the lower circuit layer 20. The preliminary upper substrate 200P may be, for example, a semiconductor substrate (e.g., a silicon wafer doped with p-type or n-type dopants). The preliminary upper substrate 200P may include a cutting layer 200A, which is formed therein. The cutting layer 200A may be formed by injecting hydrogen or helium ions into the preliminary upper substrate 200P.

Referring to FIG. 3, the upper substrate 200 may be formed by removing an upper portion of the preliminary upper substrate 200P. The formation of the upper substrate 200 may include delaminating the upper portion of the preliminary upper substrate 200P from a lower portion of the preliminary upper substrate 200P along the cutting layer 200A. In an exemplary embodiment, a planarization process may be further performed to planarize a surface of the upper substrate 200.

An upper gate insulating layer GIL and an upper gate electrode layer GEL may be sequentially formed on the upper substrate 200. In an exemplary embodiment, each of the upper gate insulating layer GIL and the upper gate electrode layer GEL may be formed using one of, for example, chemical vapor deposition, physical vapor deposition, and atomic layer deposition processes. The upper gate insulating layer GIL may be formed of or include at least one of, for example, silicon oxide, silicon nitride, silicon oxynitride, or high-k dielectric materials. Here, the high-k dielectric materials may include materials (e.g., hafnium oxide (HfO), aluminum oxide (AlO), or tantalum oxide (TaO)) whose dielectric constants are higher than that of silicon oxide.

The upper gate electrode layer GEL may be formed of or include polycrystalline silicon germanium (SiGe). In an exemplary embodiment, a concentration of germanium (Ge) in the upper gate electrode layer GEL may be greater than or equal to about 10 at % and may be smaller than about 100 at %. The upper gate electrode layer GEL may further include dopants. As an example, the dopants may be injected into the upper gate electrode layer GEL during the deposition of the upper gate electrode layer GEL. The upper gate electrode layer GEL may include, for example, a polycrystalline silicon germanium (SiGe) layer that is doped with the dopants. The dopants may include, for example, at least one of boron (B), arsenic (As), phosphorus (P), antimony (Sb), aluminum (Al), or gallium (Ga). The concentration of dopant in the upper gate electrode layer GEL may be smaller than the concentration of germanium (Ge) in the upper gate electrode layer GEL. As an example, the dopants may be boron (B), and a concentration of boron in the upper gate electrode layer GEL may be smaller than or equal to about 10 at %. As an example, a concentration of boron in the upper gate electrode layer GEL may be greater than or equal to about $1*10^{20}$ ea/cm$^3$ and may be smaller than or equal to about $1*10^{22}$ ea/cm$^3$. The upper gate electrode layer GEL may further include at least one of conductive metal nitrides and/or metals.

According to an exemplary embodiment of the inventive concept, the upper gate electrode layer GEL may be formed of or include silicon germanium (SiGe). In this case, a deposition process for forming the upper gate electrode layer GEL may be performed at a relatively low temperature (e.g., of about 450° C. or lower), and the silicon germanium (SiGe) in the upper gate electrode layer GEL may be crystallized concurrently when the upper gate electrode layer GEL is deposited. Accordingly, in an exemplary embodiment, it is not necessary to perform an additional thermal treatment process for the crystallization of the upper gate electrode layer GEL. Furthermore, since the deposition process for forming the upper gate electrode layer GEL is performed at a relatively low temperature (e.g., about 450° C. or lower), the lower transistors TR1, the first and second lower conductive lines 130 and 140, and the contacts 120, 122, and 135 in the lower circuit layer 20 may be prevented from being deteriorated.

In addition, the upper gate electrode layer GEL may include, for example, a silicon germanium (SiGe) layer doped with dopants. In this case, by controlling the concentrations of germanium (Ge) and dopant in the upper gate electrode layer GEL, a process temperature in the deposition process for forming the upper gate electrode layer GEL and electric characteristics of the upper gate electrode layer GEL may be adjusted.

Referring to FIG. 4, the upper gate electrode layer GEL and the upper gate insulating layer GIL may be sequentially patterned to form the upper gate electrode GE2 and the upper gate insulating pattern GI2, respectively. The upper gate electrode GE2 may be formed on the top surface 200U of the upper substrate 200, and the upper gate insulating pattern GI2 may be interposed between the top surface 200U of the upper substrate 200 and the upper gate electrode GE2. The upper gate spacers GSP2 may be formed on side surfaces of the upper gate electrode GE2. For example, a first upper gate spacer GSP2 may be formed on a first side surface of the upper gate electrode GE2, and a second upper gate spacer GSP2 may be formed on a second, opposing side surface of the upper gate electrode GE2. In an exemplary embodiment, the formation of the upper gate spacers GSP2 may include forming an upper gate spacer layer on the upper substrate 200, on which the upper gate insulating pattern GI2 and the upper gate electrode GE2 are formed, and anisotropically etching the upper gate spacer layer.

The upper source/drain patterns SD2 may be formed in the upper substrate 200 at both sides of the upper gate electrode GE2. The upper source/drain patterns SD2 may be formed by injecting p-type or n-type dopants into the upper substrate 200 or by performing a selective epitaxial growth process using the upper substrate 200 as a seed layer. Thus, the upper source/drain patterns SD2 may be embedded within the upper substrate 200 at opposite sides of the upper gate electrode GE2. The upper gate electrode GE2, the upper gate insulating pattern GI2, the upper gate spacers GSP2, and the upper source/drain patterns SD2 may constitute the upper transistor TR2. In an exemplary embodiment, a plurality of upper transistors TR2 may be formed on the top surface 200U of the upper substrate 200.

Referring back to FIG. 1, the first upper interlayer insulating layer 210 may be formed on the upper substrate 200 to cover the upper transistors TR2. The first upper interlayer insulating layer 210 may be formed using, for example, a chemical vapor deposition process.

The upper source/drain contacts 220 and the upper gate contacts 222 may be formed in the first upper interlayer insulating layer 210. The upper source/drain contacts 220 and the upper gate contacts 222 may be formed by substantially the same method as that used to form the lower source/drain contacts 120 and the lower gate contacts 122. The upper source/drain patterns SD2 of each of the upper transistors TR2 may be respectively connected to corresponding ones of the upper source/drain contacts 220, and the upper gate electrode GE2 of each of the upper transistors TR2 may be connected to a corresponding one of the upper gate contacts 222.

The upper penetration via 300 may penetrate the first upper interlayer insulating layer 210 and the upper substrate 200 and extend into the second lower interlayer insulating layer 150.

In an exemplary embodiment, the formation of the upper penetration via 300 may include forming an upper penetration hole to penetrate the first upper interlayer insulating layer 210 and the upper substrate 200 and to extend into the second lower interlayer insulating layer 150, forming a conductive layer on the first upper interlayer insulating layer 210 to fill the upper penetration hole, and planarizing the conductive layer to expose the first upper interlayer insulating layer 210. The upper penetration via 300 may be electrically disconnected from the upper substrate 200 and may be connected to at least one of the first and second lower conductive lines 130 and 140 of the lower circuit layer 20.

The first upper conductive lines 230 may be formed on the first upper interlayer insulating layer 210. In an exemplary embodiment, the first upper conductive lines 230 may be formed by substantially the same method as that used to form the first lower conductive lines 130. In an exemplary embodiment, at least one of the first upper conductive lines 230 may be connected to the upper penetration via 300. As an example, at least one of the second lower conductive lines 140 may be connected to at least one of the first upper conductive lines 230 through the upper penetration via 300.

The upper conductive contacts 235 and the second upper conductive lines 240 may be formed on the first upper conductive lines 230, and the second upper interlayer insulating layer 250 may be formed to cover the first and second upper conductive lines 230 and 240 and the upper conductive contacts 235. The upper conductive contacts 235, the second upper conductive lines 240, and the second upper interlayer insulating layer 250 may be formed by substantially the same method as that used to form the lower conductive contacts 135, the second lower conductive lines 140, and the second lower interlayer insulating layer 150.

Figure 5:
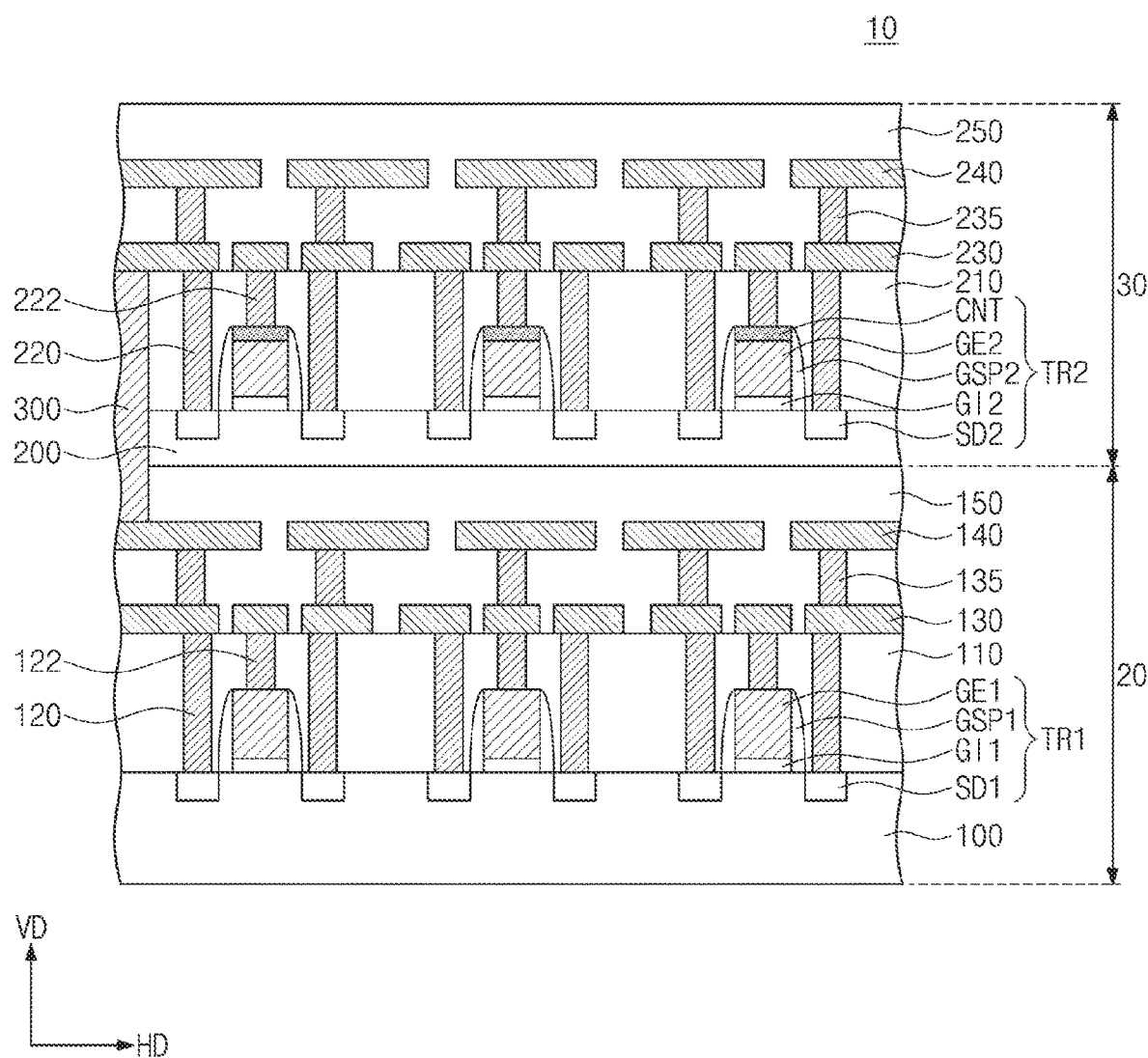
FIG. 5 is a cross-sectional view illustrating a three-dimensional semiconductor device according to an exemplary embodiment of the inventive concept.

FIG. 5 is a cross-sectional view illustrating a three-dimensional semiconductor device according to an exemplary embodiment of the inventive concept. For convenience of explanation, the description that follows will mainly refer to features different from those in the three-dimensional semiconductor device described above with reference to FIG. 1, and a further description of elements and technical aspects previously described may be omitted.

Referring to FIG. 5, each of the upper transistors TR2 of the upper circuit layer 30 may further include an ohmic contact CNT disposed on the upper gate electrode GE2. The ohmic contact CNT may be interposed between the upper gate electrode GE2 and a corresponding one of the upper gate contacts 222. The ohmic contact CNT may be used to realize an ohmic contact property between the upper gate electrode GE2 and the corresponding upper gate contact 222. In an exemplary embodiment, the ohmic contact CNT may be formed of or include at least one of, for example, metal silicides and/or metal germanides. Except for this difference, the three-dimensional semiconductor device described with reference to FIG. 5 may be substantially the same as the three-dimensional semiconductor device described with reference to FIG. 1.

Figure 6:
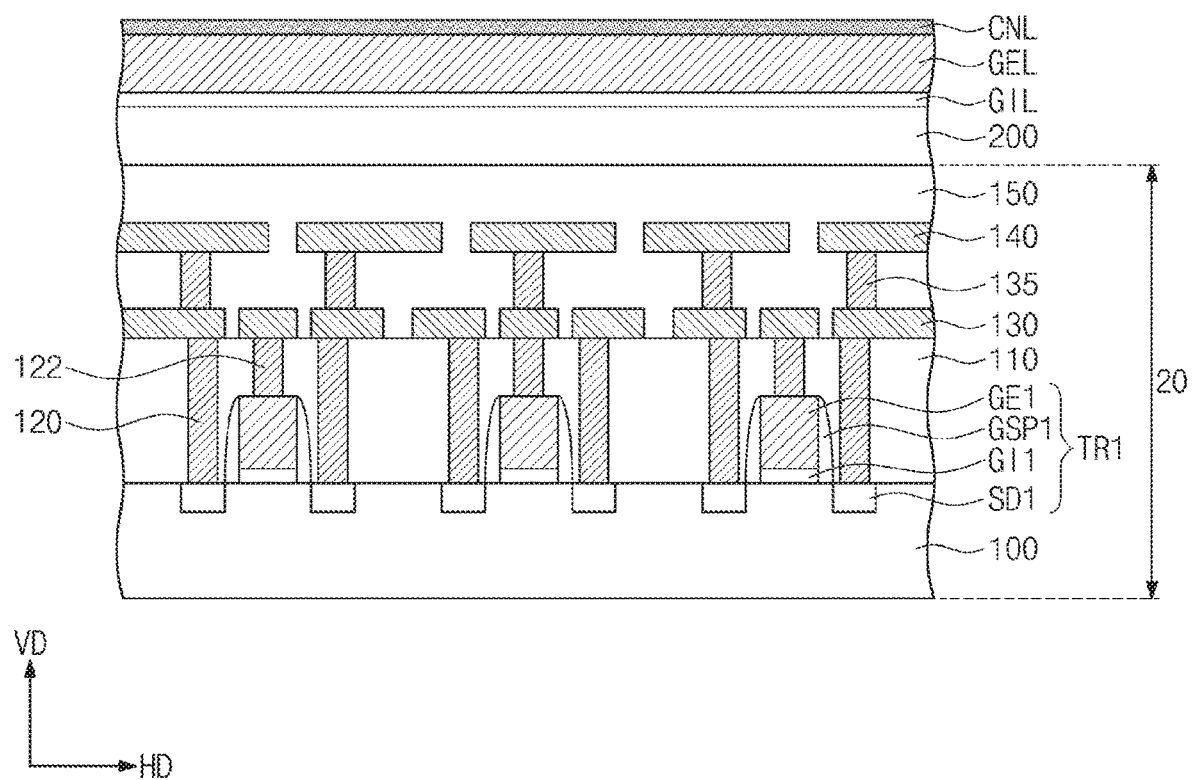
FIG. 6 is a cross-sectional view illustrating a method of fabricating a three-dimensional semiconductor device, according to an exemplary embodiment of the inventive concept.

FIG. 6 is a cross-sectional view illustrating a method of fabricating a three-dimensional semiconductor device, according to an exemplary embodiment of the inventive concept. For convenience of explanation, the description that follows will mainly refer to features a different from those in the fabrication method described with reference to FIGS. 1 to 4, and a further description of elements and technical aspects previously described may be omitted.

Referring to FIG. 6, the upper substrate 200 may be formed on the lower circuit layer 20, and the upper gate insulating layer GIL and the upper gate electrode layer GEL may be sequentially formed on the upper substrate 200. The lower circuit layer 20, the upper substrate 200, the upper gate insulating layer GIL, and the upper gate electrode layer GEL may be formed by substantially the same method as that described with reference to FIGS. 2 and 3. In an exemplary embodiment, an ohmic contact layer CNL may be formed on the upper gate electrode layer GEL. The ohmic contact layer CNL may be formed using one of, for example, chemical vapor deposition, physical vapor deposition, and atomic layer deposition processes. The ohmic contact layer CNL may be formed of or include, for example, at least one of metal silicides and/or metal germanides.

Referring back to FIG. 5, the ohmic contact layer CNL, the upper gate electrode layer GEL, and the upper gate insulating layer GIL may be sequentially patterned to form an ohmic contact CNT, the upper gate electrode GE2, and the upper gate insulating pattern GI2, respectively. The upper gate spacers GSP2 may be formed on side surfaces of the upper gate electrode GE2, and the upper source/drain patterns SD2 may be formed in the upper substrate 200 at both sides of the upper gate electrode GE2. For example, the upper source/drain patterns SD2 may be embedded within the upper substrate 200 at both sides of the upper gate electrode GE2. The ohmic contact CNT, the upper gate electrode GE2, the upper gate insulating pattern GI2, the upper gate spacers GSP2, and the upper source/drain patterns SD2 may constitute the upper transistor TR2. Except for the differences described above, the method of fabricating a three-dimensional semiconductor device according to the present exemplary embodiment may be substantially the same as the method described with reference to FIGS. 1 to 4.

Figure 7:
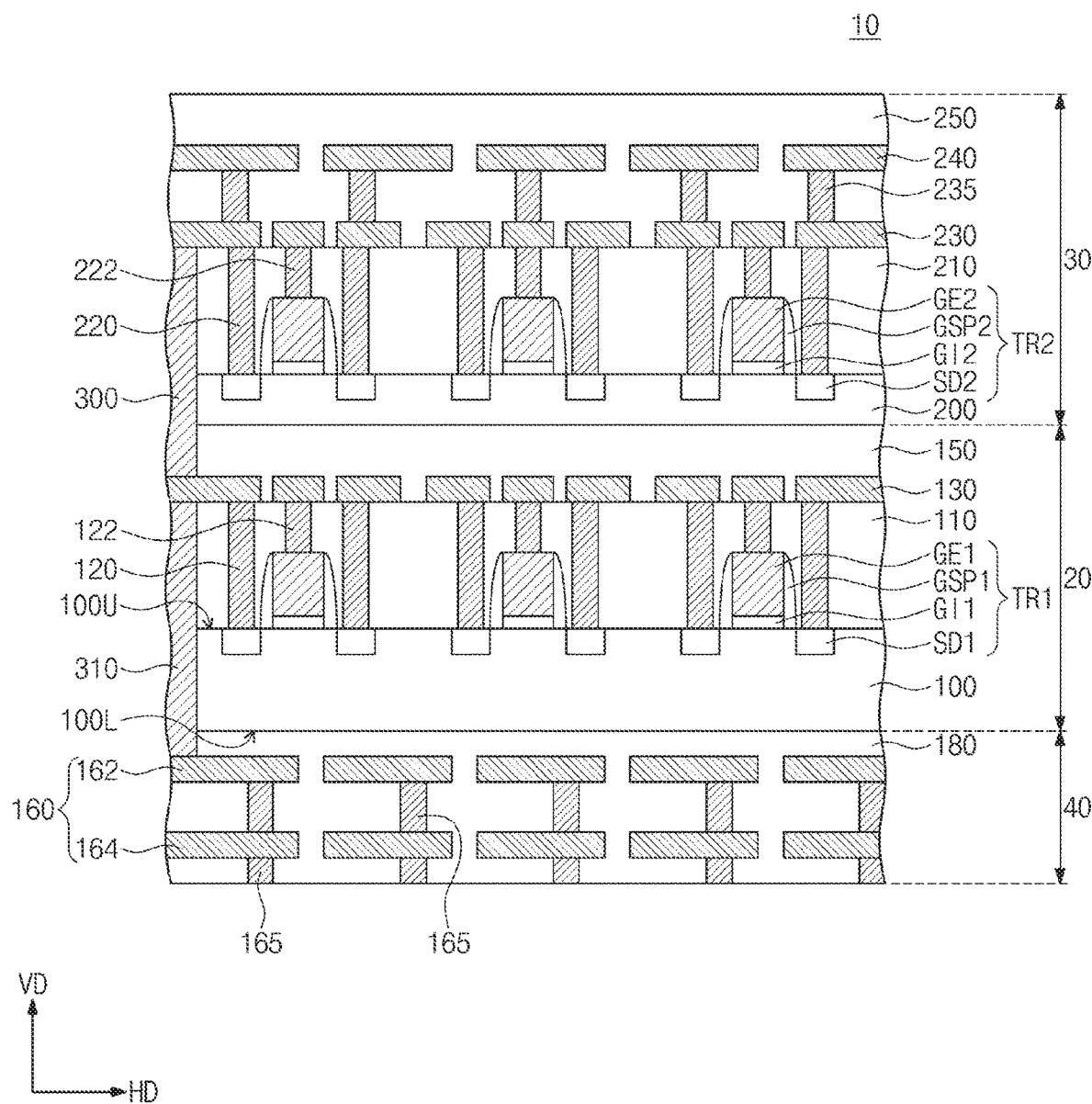
FIG. 7 is a cross-sectional view illustrating a three-dimensional semiconductor device, according to an exemplary embodiment of the inventive concept.

FIG. 7 is a cross-sectional view illustrating a three-dimensional semiconductor device, according to an exemplary embodiment of the inventive concept. For convenience of explanation, the description that follows will mainly refer to features different from those in the three-dimensional semiconductor device described above with reference to FIG. 1, and a further description of elements and technical aspects previously described may be omitted.

Referring to FIG. 7, the three-dimensional semiconductor device 10 may further include an interconnection layer 40 disposed below the lower circuit layer 20. The lower circuit layer 20 may be disposed between the interconnection layer 40 and the upper circuit layer 30. The lower circuit layer 20 and the upper circuit layer 30 may be sequentially stacked on the interconnection layer 40 in the vertical direction VD.

The interconnection layer 40 may include interconnection lines 160 and interconnection contacts 165. Some of the interconnection contacts 165 may connect the interconnection lines 160 to each other, and others of the interconnection contacts 165 may connect some of the interconnection lines 160 to an external device. In an exemplary embodiment, the interconnection lines 160 may include uppermost interconnection lines 162, which are disposed adjacent to the lower substrate 100, and lowermost interconnection lines 164, which are disposed further from the lower substrate 100 compared to the uppermost interconnection lines 162. The uppermost interconnection lines 162 may be spaced apart from the lowermost interconnection lines 164 in the vertical direction VD.

Some of the interconnection contacts 165 may be disposed between the uppermost interconnection lines 162 and the lowermost interconnection lines 164. Each of the uppermost interconnection lines 162 may be connected to a corresponding one of the lowermost interconnection lines 164 through a corresponding one of the interconnection contacts 165. Others of the interconnection contacts 165 may connect the lowermost interconnection lines 164 to the external device. The interconnection lines 160 and the interconnection contacts 165 may be formed of or include at least one of, for example, metals (e.g., copper (Cu), ruthenium (Ru), molybdenum (Mo), tungsten (W), and cobalt (Co)). In an exemplary embodiment, the interconnection lines 160 and the interconnection contacts 165 may be configured to supply electric power to the lower circuit layer 20 and the upper circuit layer 30. As an example, the interconnection lines 160 and the interconnection contacts 165 may constitute a power distribution network (PDN).

The interconnection layer 40 may include an insulating layer 180 covering the interconnection lines 160 and the interconnection contacts 165. The insulating layer 180 may be formed of or include at least one of, for example, silicon oxide, silicon nitride, silicon oxynitride, or low-k dielectric materials.

The lower substrate 100 of the lower circuit layer 20 may have the top surface 100U and a bottom surface 100L opposite to each other. The lower transistors TR1 of the lower circuit layer 20 may be disposed on the top surface 100U of the lower substrate 100, and the interconnection layer 40 may be disposed on the bottom surface 100L of the lower substrate 100.

The lower circuit layer 20 may include the first lower conductive lines 130 disposed on the first lower interlayer insulating layer 110. Each of the lower source/drain contacts 120 and the lower gate contacts 122 may be connected to a corresponding one of the first lower conductive lines 130. In an exemplary embodiment, the second lower conductive lines 140 and the lower conductive contacts 135 may be omitted.

The three-dimensional semiconductor device 10 may include the upper penetration via 300, which is used to electrically connect the lower circuit layer 20 to the upper circuit layer 30, and a lower penetration via 310, which is used to electrically connect the lower circuit layer 20 to the interconnection layer 40. The lower penetration via 310 may also be referred to herein as a lower penetration electrode. In an exemplary embodiment, the upper penetration via 300 may penetrate the upper substrate 200 of the upper circuit layer 30, and the lower penetration via 310 may penetrate the lower substrate 100 of the lower circuit layer 20. The upper penetration via 300 and the lower penetration via 310 may be electrically disconnected from the upper substrate 200 and the lower substrate 100, respectively.

At least one of the first lower conductive lines 130 of the lower circuit layer 20 may be connected to at least one of the first and second upper conductive lines 230 and 240 of the upper circuit layer 30 through the upper penetration via 300. As an example, at least one of the first lower conductive lines 130 may be connected to at least one of the first upper conductive lines 230 through the upper penetration via 300. At least one of the first lower conductive lines 130 of the lower circuit layer 20 may be connected to at least one of the interconnection lines 160 of the interconnection layer 40 through the lower penetration via 310. As an example, at least one of the first lower conductive lines 130 may be connected to at least one of the uppermost interconnection lines 160 through the lower penetration via 310. Each of the upper penetration via 300 and the lower penetration via 310 may be formed of or include at least one of, for example, conductive metal nitrides and/or metals (e.g., copper (Cu), ruthenium (Ru), molybdenum (Mo), tungsten (W), and cobalt (Co)).

One terminal (e.g., one of the lower source/drain patterns SD1) of at least one of the lower transistors TR1 may be electrically connected to one terminal (e.g., one of the upper source/drain patterns SD2) of at least one of the upper transistors TR2 through a corresponding one of the first lower conductive lines 130, the upper penetration via 300, and corresponding ones of the first and second upper conductive lines 230 and 240. One terminal (e.g., one of the lower source/drain patterns SD1) of at least one of the lower transistors TR1 may be connected to a corresponding one of the first lower conductive lines 130, the lower penetration via 310, and corresponding ones of the interconnection lines 160.

Except for the differences described above, the three-dimensional semiconductor device according to the present exemplary embodiment may be substantially the same as the three-dimensional semiconductor device described above with reference to FIG. 1.

Figure 8:
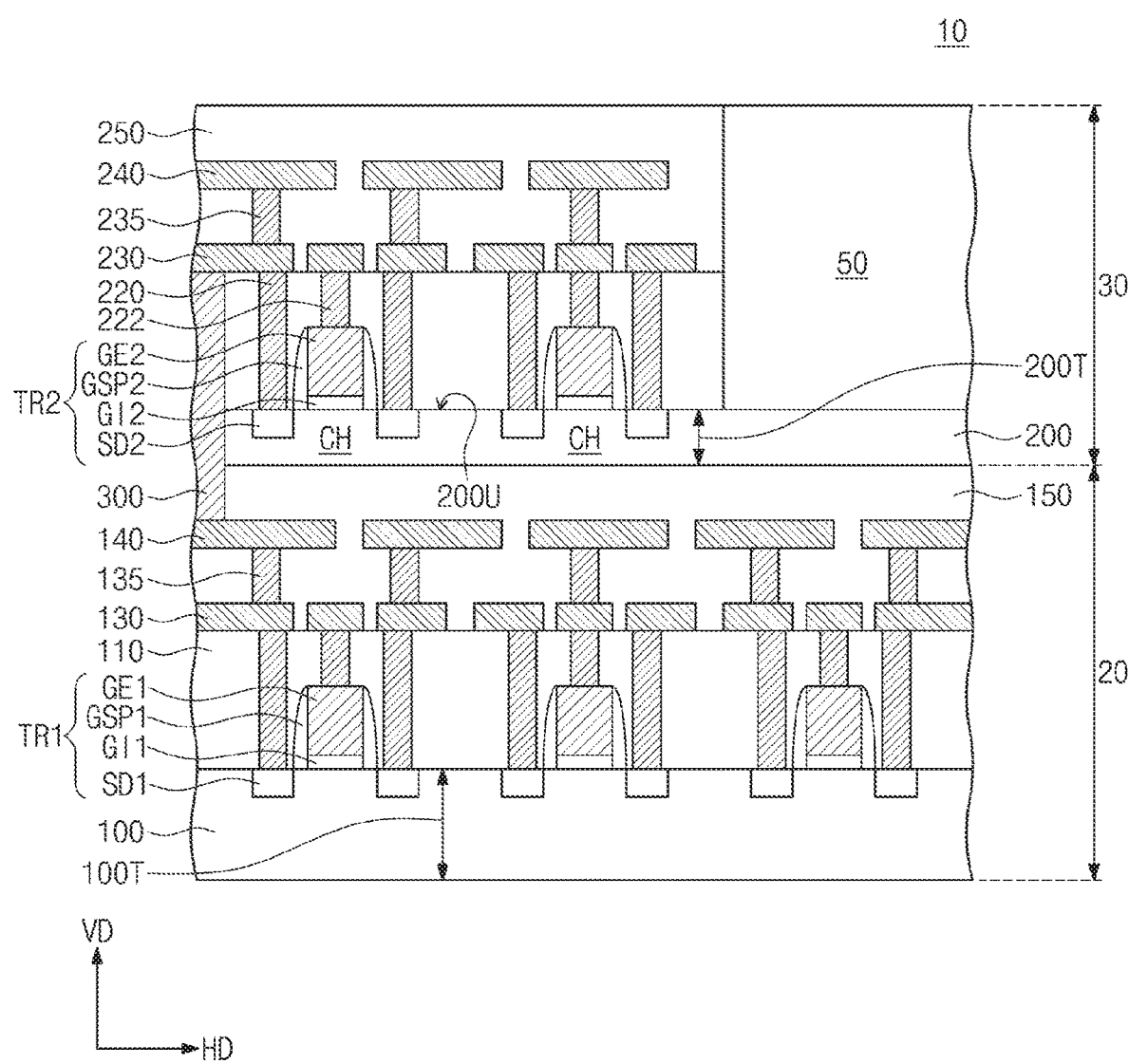
FIG. 8 is a cross-sectional view illustrating a three-dimensional semiconductor device, according to an exemplary embodiment of the inventive concept.

FIG. 8 is a cross-sectional view illustrating a three-dimensional semiconductor device according to an exemplary embodiment of the inventive concept. FIGS. 9 to 13 are circuit diagrams illustrating some examples of a memory cell array 50 according to exemplary embodiments of the inventive concept, which may be disposed on the upper substrate 200 of FIG. 8. For convenience of explanation, the description that follows will mainly refer to features different from those in the three-dimensional semiconductor device described above with reference to FIG. 1, and a further description of elements and technical aspects previously described may be omitted.

Referring to FIG. 8, the upper circuit layer 30 may include a memory cell array 50 disposed on the upper substrate 200. On the upper substrate 200, the memory cell array 50 may be horizontally spaced apart from the upper transistors TR2.

Figure 9:
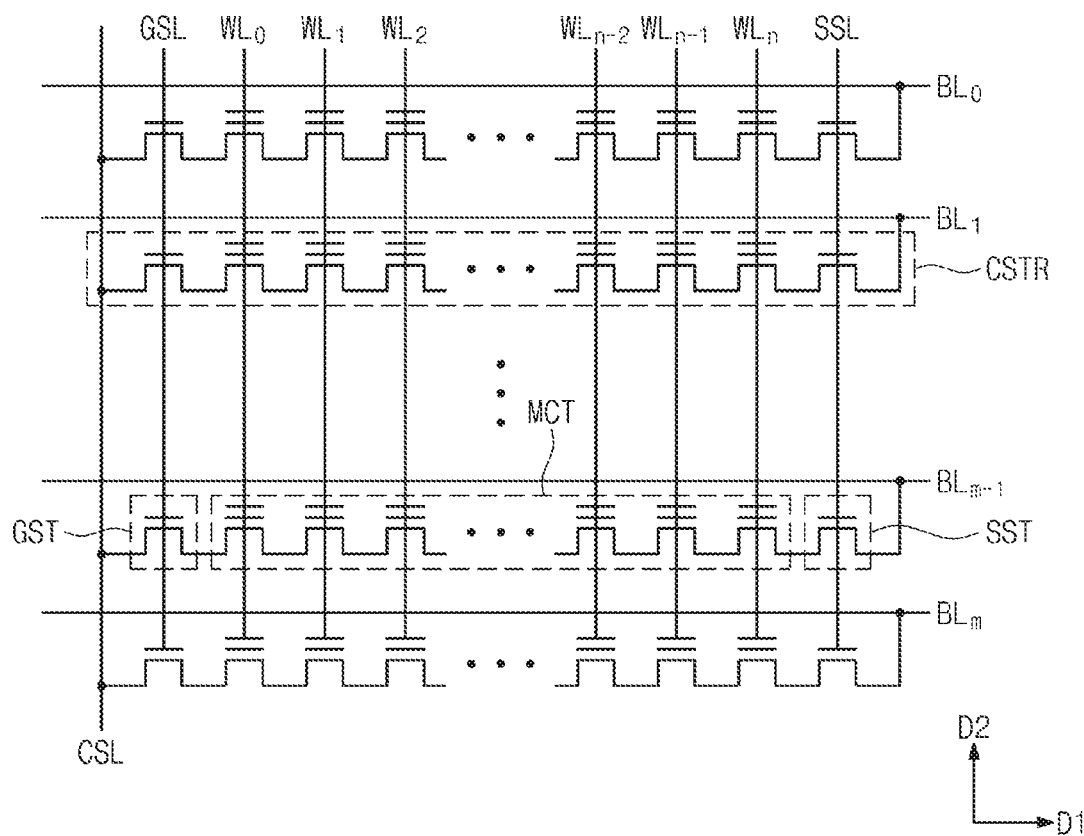
FIGS. 9 to 13 are circuit diagrams illustrating some examples of a memory cell array according to exemplary embodiments of the inventive concept, which may be disposed on an upper substrate of FIG. 8.

Referring to FIGS. 8 and 9, in an exemplary embodiment, the memory cell array 50 may be a two-dimensional NAND FLASH memory cell array. For example, the memory cell array 50 may include a plurality of cell strings CSTR. Each of the cell strings CSTR may include a string selection transistor SST connected to a string selection line SSL, a plurality of memory cell transistors MCT respectively connected to a plurality of word lines $WL_0$-$WL_n$ (where n is a natural number), and a ground selection transistor GST connected to a ground selection line GSL. The string selection transistor SST may be connected to one of a plurality of bit lines $BL_0$-$BL_m$ (where m is a natural number), and the ground selection transistor GST may be connected to a common source line CSL. The bit lines $BL_0$-$BL_m$ may extend in a first direction D1, and the string selection line SSL, the word lines $WL_0$-$WL_n$, and the ground selection line GSL may extend in a second direction D2 crossing the first direction D1. The first direction D1 and the second direction D2 may be parallel to a top surface 200U of the upper substrate 200.

The string selection line SSL, the word lines $WL_0$-$WL_n$, and the ground selection line GSL may be disposed on the upper substrate 200 and may be placed at substantially the same level from the upper substrate 200. The string selection line SSL, the word lines $WL_0$-$WL_n$, and the ground selection line GSL may be used as gate electrodes of the string selection transistor SST, the memory cell transistors MCT, and the ground selection transistor GST, respectively. Each of the memory cell transistors MCT may include a data storage element.

Figure 10:
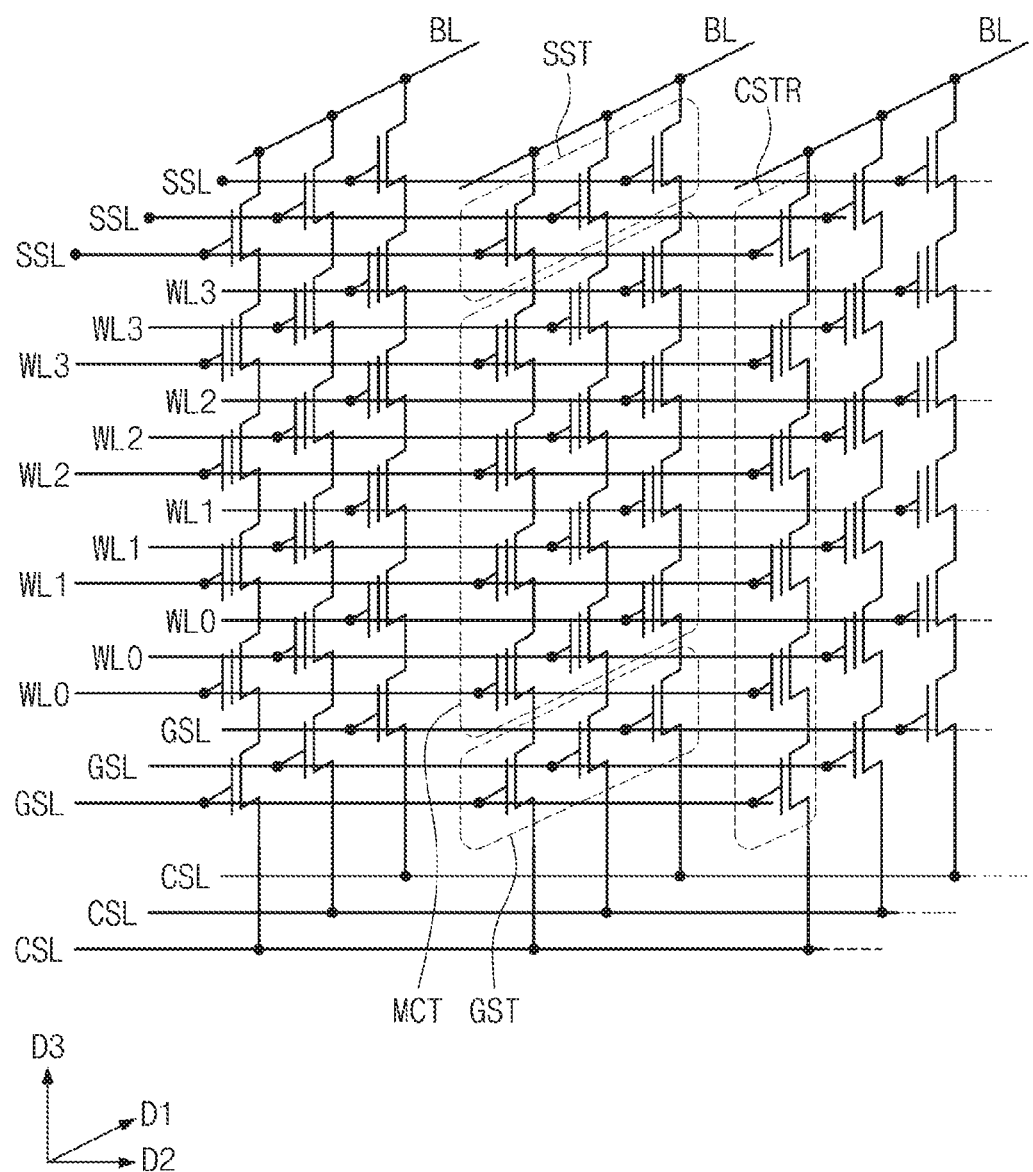

Referring to FIGS. 8 and 10, in an exemplary embodiment, the memory cell array 50 may be a three-dimensional NAND FLASH memory cell array. For example, the memory cell array 50 may include a common source line CSL, a plurality of bit lines BL, and a plurality of cell strings CSTR, which are disposed between the common source line CSL and the bit lines B L.

The common source line CSL may be, for example, a conductive thin film disposed on the upper substrate 200 or an impurity region formed in the upper substrate 200. The bit lines BL may be conductive patterns (e.g., metal lines), which are spaced apart from the upper substrate 200 in a third direction D3 perpendicular to the top surface 200U of the upper substrate 200. The bit lines BL may extend in the first direction D1 and may be spaced apart from each other in the second direction D2. A plurality of cell strings CSTR may be connected in parallel to each of the bit lines BL. The cell strings CSTR may be connected in common to the common source line CSL. In an exemplary embodiment, a plurality of the common source lines CSL may be two-dimensionally arranged on the upper substrate 200. Here, the same voltage may be applied to the common source lines CSL, but in an exemplary embodiment, the electric potentials of the common source lines CSL may be controlled independently.

Each of the cell strings CSTR may be composed of a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the string selection transistor SST, and the memory cell transistors MCT may be connected in series.

The common source line CSL may be connected in common to sources of the ground selection transistors GST. A ground selection line GSL, a plurality of word lines WL0-WL3, and a string selection line SSL, which are disposed between the common source line CSL and the bit lines BL, may be used as gate electrodes of the ground selection transistor GST, the memory cell transistors MCT, and the string selection transistor SST, respectively. The ground selection line GSL, the plurality of word lines WL0-WL3, and the string selection line SSL may be stacked on the upper substrate 200 in the third direction D3. Each of the memory cell transistors MCT may include a data storage element.

Figure 11:
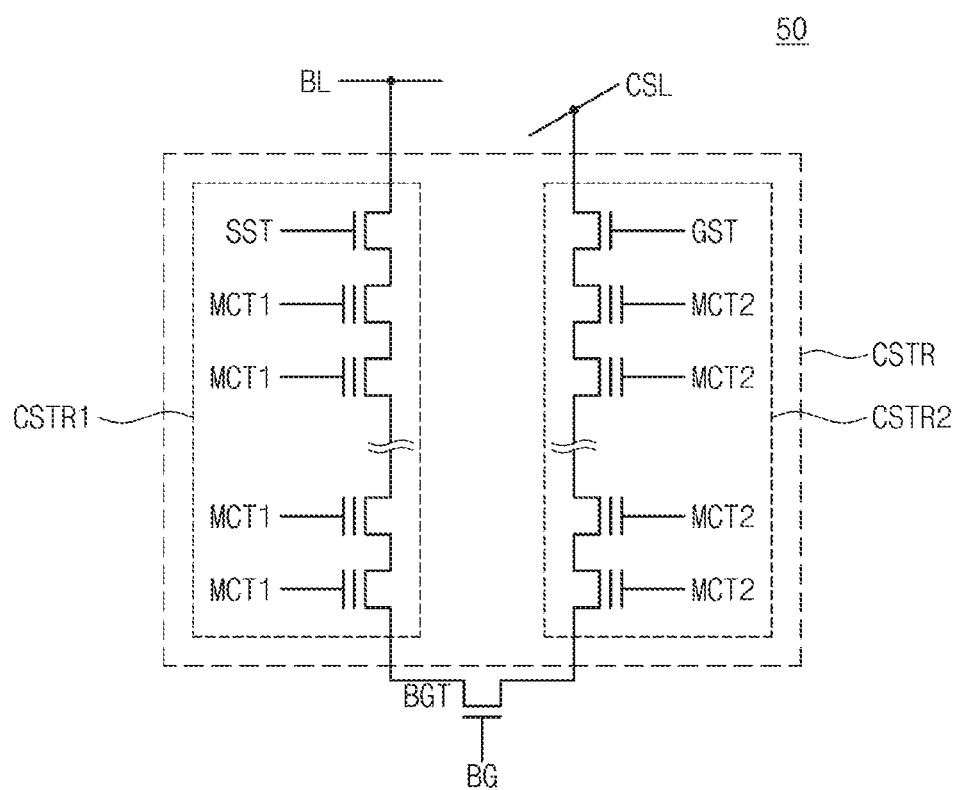

Referring to FIGS. 8 and 11, in an exemplary embodiment, the memory cell array 50 may be a three-dimensional FLASH memory cell array. For example, the memory cell array 50 may include a common source line CSL, a bit line BL, and a cell string CSTR between the common source line CSL and the bit line BL. The common source line CSL may be, for example, a conductive layer or a conductive pattern disposed on the upper substrate 200, and the bit line BL may be, for example, a conductive pattern (e.g., a metal line) disposed on the upper substrate 200. The common source line CSL and the bit line BL may be spaced apart from the substrate 100 in a direction perpendicular to the top surface 200U of the upper substrate 200.

The cell string CSTR may be disposed between the upper substrate 200 and the common source line CSL and between the upper substrate 200 and the bit line BL. The cell string CSTR may include an upper string CSTR1 connected to the bit line BL and a lower string CSTR2 connected to the common source line CSL. The upper string CSTR1 may be connected to the lower string CSTR2 through a back-gate transistor BGT. The back-gate transistor BGT may be controlled by a back-gate line BG disposed on the upper substrate 200. The upper string CSTR1 may include a string selection transistor SST, which is coupled to the bit line BL, and a plurality of upper memory cell transistors MCT1, which are disposed between the string selection transistor SST and the back-gate transistor BGT. The string selection transistor SST and the upper memory cell transistors MCT1 may be connected in series. The lower string CSTR2 may include a ground selection transistor GST, which is coupled to the common source line CSL, and a plurality of lower memory cell transistors MCT2, which are disposed between the ground selection transistor GST and the back-gate transistor BGT. The ground selection transistor GST and the lower memory cell transistors MCT2 may be connected in series. Each of the upper and lower memory cell transistors MCT1 and MCT2 may include a data storage element.

Figure 12:
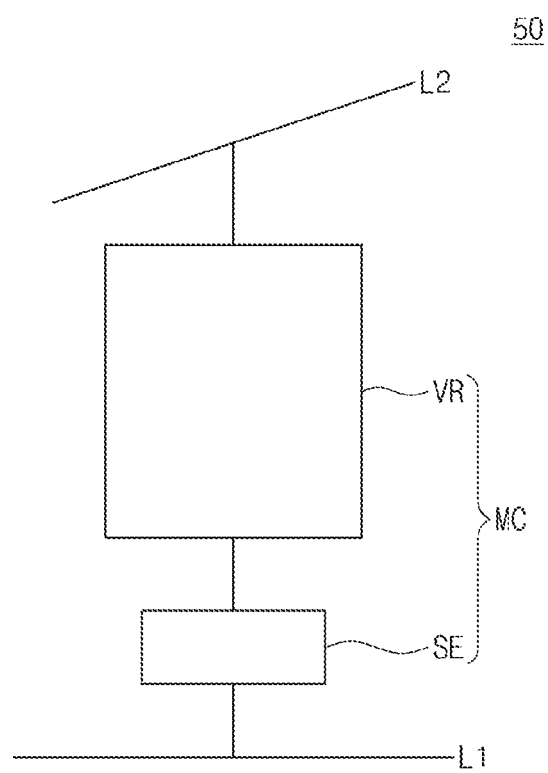

Referring to FIGS. 8 and 12, in an exemplary embodiment, the memory cell array 50 may be a variable resistance memory cell array. The variable resistance memory cell array may include at least one of magnetic random access memory (MRAM), phase-change RAM (PRAM), or resistive-RAM (RRAM) elements. The memory cell array 50 may include a first conductive line L1, a second conductive line L2 crossing the first conductive line L1, and a unit memory cell MC, which is disposed at each intersection of the first and second conductive lines L1 and L2. The first conductive line L1 and the second conductive line L2 may be disposed on the upper substrate 200 and may extend in a direction parallel to the top surface 200U of the upper substrate 200. The first conductive line L1 and the second conductive line L2 may cross each other. The second conductive line L2 may be disposed at a level higher than the first conductive line L1, when measured from the top surface 200U of the upper substrate 200.

The memory cell MC may include a variable resistance element VR and a selection element SE. The variable resistance element VR and the selection element SE may be connected in series to each other between the first conductive line L1 and the second conductive line L2.

The variable resistance element VR may include a data storage element. The variable resistance element VR may include a material which has a variable resistance property, thus, allowing the variable resistance element VR to be used as a data-storing element. In an exemplary embodiment, the variable resistance element VR may include a magnetic tunnel junction pattern, which has a fixed layer, a free layer, and a tunnel barrier layer between the fixed layer and the free layer. Here, the fixed layer may have a fixed magnetization direction, and the free layer may have a switchable magnetization direction that can be changed to be parallel or antiparallel to the magnetization direction of the fixed layer. In this case, the memory cell MC may constitute an MRAM cell. In exemplary embodiments, the variable resistance element VR may include a material whose phase can be changed to one of crystalline and amorphous structures, depending on its temperature. For example, the variable resistance element VR may include a compound in which at least one of chalcogen elements (e.g., Te and Se) and at least one of Ge, Sb, Bi, Pb, Sn, Ag, As, S, Si, In, Ti, Ga, P, O, and C are contained. The variable resistance element VR may include at least one of, for example, GeSbTe, GeTeAs, SbTeSe, GeTe, SbTe, SeTeSn, GeTeSe, SbSeBi, GeBiTe, GeTeTi, InSe, GaTeSe, or InSbTe, or may have a super lattice structure, in which a Ge-containing layer (e.g., GeTe layer) and a Ge-free layer (e.g., SbTe layer) are repeatedly stacked. In this case, the memory cell MC may constitute a PRAM cell.

The selection element SE may be configured to selectively control a current flow of electric charges passing through the variable resistance element VR. For example, the selection element SE may include a bipolar transistor or a metal-oxide-semiconductor field effect (MOSFET) transistor. In this case, the memory cell MC may further include a third conductive line, which is used to control the selection element SE. In exemplary embodiments, the selection element SE may include an ovonic threshold switch (OTS) device, which has a non-linear (e.g., S-shaped) I-V curve, based on a threshold switching phenomenon.

Figure 13:
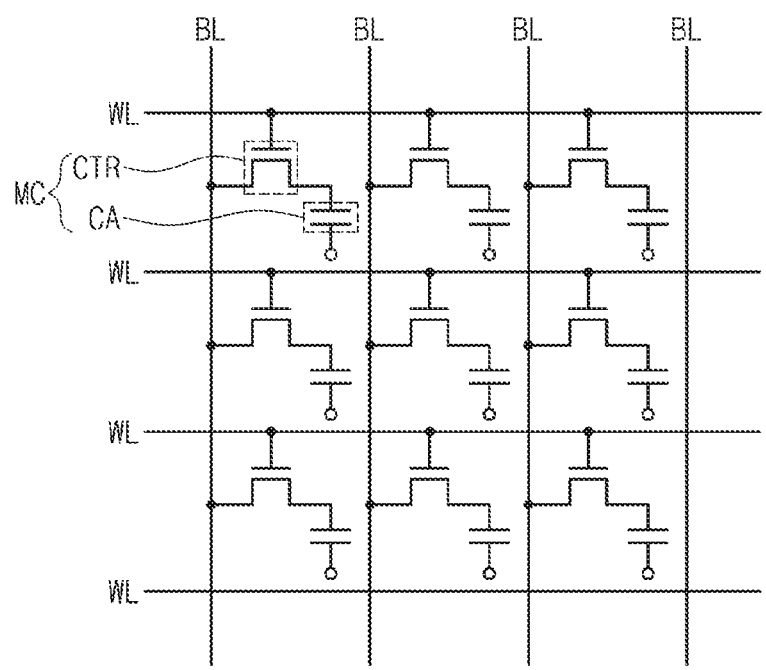

Referring to FIGS. 8 and 13, in an exemplary embodiment, the memory cell array 50 may be a dynamic random access memory (DRAM) cell array. For example, the memory cell array 50 may include word lines WL, bit lines BL crossing the word lines WL, and a plurality of memory cells MC. Each of the memory cells MC may be connected to a corresponding one of the word lines WL and to a corresponding one of the bit lines BL. Each of the memory cells MC may include a cell transistor CTR, which is connected to the corresponding word line WL, and a capacitor CA, which is connected to one terminal of the cell transistor CTR. A drain region of the cell transistor CTR may be connected to the corresponding bit line BL, and a source region of the cell transistor CTR may be connected to the capacitor CA. The cell transistor CTR may be configured to selectively control a current flow of electric charges flowing to the capacitor CA. Each of the memory cells MC may store data of "0" or "1", depending on an amount of charges stored in the capacitor CA.

Referring back to FIG. 8, except for the differences described above, the three-dimensional semiconductor device according to the present exemplary embodiment may be substantially the same as the three-dimensional semiconductor device described with reference to FIG. 1.

Figure 14:
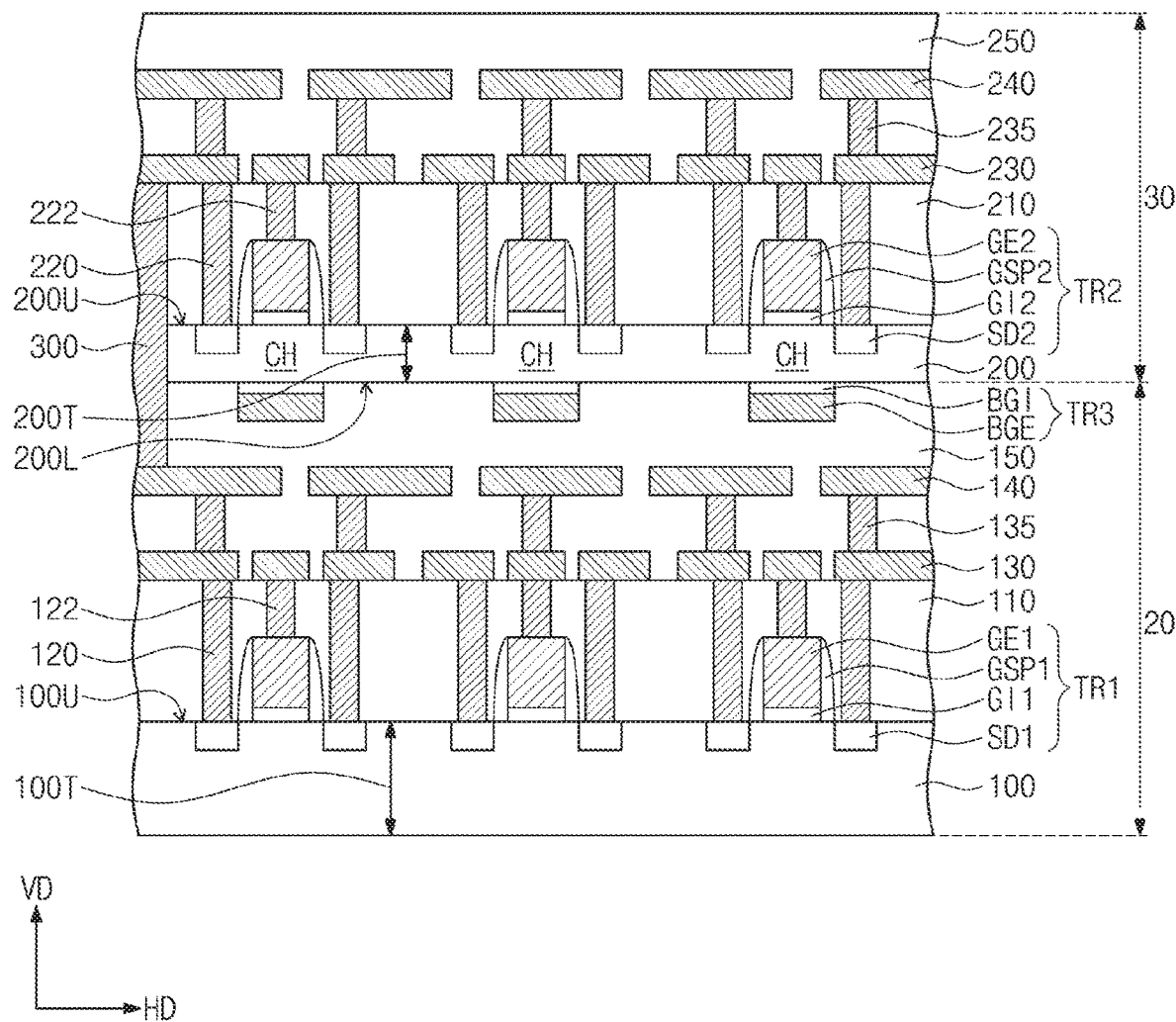
FIG. 14 is a cross-sectional view illustrating a three-dimensional semiconductor device, according to an exemplary embodiment of the inventive concept.

FIG. 14 is a cross-sectional view illustrating a three-dimensional semiconductor device, according to an exemplary embodiment of the inventive concept. For convenience of explanation, the description that follows will mainly refer to features different from those in the three-dimensional semiconductor device described with reference to FIG. 1, and a further description of elements and technical aspects previously described may be omitted.

Referring to FIG. 14, in an exemplary embodiment, the three-dimensional semiconductor device 10 may further include intermediate transistors TR3 disposed below the upper circuit layer 30. The upper substrate 200 of the upper circuit layer 30 may have the top surface 200U and the bottom surface 200L opposite to each other. The upper transistors TR2 of the upper circuit layer 30 may be disposed on the top surface 200U of the upper substrate 200, and the intermediate transistors TR3 may be disposed on the bottom surface 200L of the upper substrate 200. The intermediate transistors TR3 may be disposed in the second lower interlayer insulating layer 150 of the lower circuit layer 20. The intermediate transistors TR3 may be configured to adjust threshold voltages of the upper transistors TR2.

Each of the intermediate transistors TR3 may include a back-gate electrode BGE, which is disposed on the bottom surface 200L of the upper substrate 200, and a back-gate insulating layer BGI, which is interposed between the back-gate electrode BGE and the upper substrate 200. The back-gate electrode BGE may be formed of or include at least one of, for example, metals and/or conductive metal nitrides, and the back-gate insulating layer BGI may be formed of or include, for example, at least one of silicon oxide, silicon nitride, silicon oxynitride, or high-k dielectric materials. Here, the high-k dielectric materials may include materials (e.g., hafnium oxide (HfO), aluminum oxide (AlO), or tantalum oxide (TaO)) whose dielectric constants are higher than that of silicon oxide.

The intermediate transistors TR3 may be positioned at a level higher than the first and second lower conductive lines 130 and 140 of the lower circuit layer 20. Except for the differences described above, the three-dimensional semiconductor device described with reference to FIG. 14 may be substantially the same as the three-dimensional semiconductor device described with reference to FIG. 1.

According to an exemplary embodiment of the inventive concept, an upper gate electrode of each of upper transistors may be formed of or include polycrystalline silicon germanium (SiGe). In this case, a deposition process for forming the upper gate electrode may be performed at a relatively low temperature (e.g., about 450° C. or lower). Accordingly, in exemplary embodiments, structures constituting a lower circuit layer may be prevented from being deteriorated during the formation of the upper gate electrode. Furthermore, the upper gate electrode further includes dopants. In this case, by controlling concentrations of germanium and the dopant in the upper gate electrode, a process temperature in the deposition process for forming the upper gate electrode and electric characteristics of the upper gate electrode may be adjusted. Accordingly, exemplary embodiments provide an improved fabrication method of a three-dimensional semiconductor device with improved characteristics.

In an exemplary embodiment of the present inventive concept, a three-dimensional memory array is provided. The three-dimensional memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the three-dimensional memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:
1. A three-dimensional semiconductor device, comprising:
    a lower substrate;
    a plurality of lower transistors disposed on the lower substrate;
    an upper substrate disposed on the lower transistors;
    a plurality of lower conductive lines disposed between the lower transistors and the upper substrate;
    a plurality of upper transistors disposed on a top surface of the upper substrate;
    a plurality of upper conductive lines disposed on the upper transistors;
    an upper penetration via penetrating the upper substrate; and
    a plurality of intermediate transistors disposed on a bottom surface of the upper substrate,
    wherein at least one of the lower transistors is connected to a corresponding one of the lower conductive lines, and at least one of the upper transistors is connected to a corresponding one of the upper conductive lines,
    wherein each of the upper transistors comprises:
        an upper gate electrode disposed on the top surface of the upper substrate;
        a first upper source/drain pattern disposed in the upper substrate at a first side of the upper gate electrode; and
        a second upper source/drain pattern disposed in the upper substrate at a second, opposing side of the upper gate electrode,
    wherein each of the lower transistors comprises:
        a lower gate electrode disposed on the lower substrate;
        a first lower source/drain pattern disposed in the lower substrate at a first side of the lower gate electrode; and
        a second lower source/drain pattern disposed in the lower substrate at a second, opposing side of the lower gate electrode,
        wherein the upper gate electrode comprises polycrystalline silicon germanium (SiGe), and the lower gate electrode comprises polycrystalline silicon or polycrystalline germanium,
    wherein one terminal of the at least one of the lower transistors is electrically connected to one terminal of the at least one of the upper transistors through corresponding ones of the lower conductive lines, the upper penetration via and corresponding ones of the upper conductive lines,
    wherein the upper penetration via extends above the upper substrate and is disposed adjacent to the upper gate electrode of at least one of the upper transistors above the upper substrate,
    wherein each of the plurality of intermediate transistors comprises:
        a back-gate electrode disposed on the bottom surface of the upper substrate; and
        a back-gate insulating layer interposed between the upper substrate and the back-gate electrode.
2. The three-dimensional semiconductor device of claim 1, wherein the upper substrate comprises a channel region disposed below the upper gate electrode, and the channel region comprises silicon.

3. The three-dimensional semiconductor device of claim 1, wherein a concentration of germanium (Ge) in the upper gate electrode is greater than or equal to about 10 at % and is smaller than about 100 at %.

4. The three-dimensional semiconductor device of claim 1, wherein the upper gate electrode further comprises a dopant.

5. The three-dimensional semiconductor device of claim 4, wherein the dopant comprises at least one of boron (B), arsenic (As), phosphorus (P), antimony (Sb), aluminum (Al), or gallium (Ga).

6. The three-dimensional semiconductor device of claim 4, wherein the dopant comprises boron (B), and a concentration of the boron (B) in the upper gate electrode is smaller than or equal to about 10 at %.

7. The three-dimensional semiconductor device of claim 4, wherein a concentration of the dopant in the upper gate electrode is smaller than a concentration of germanium (Ge) in the upper gate electrode.

8. The three-dimensional semiconductor device of claim 1, wherein each of the upper transistors comprises an upper gate insulating pattern interposed between the upper substrate and the upper gate electrode.

9. The three-dimensional semiconductor device of claim 1,
wherein at least one of the lower conductive lines is connected to at least one of the upper conductive lines through the upper penetration via.

10. The three-dimensional semiconductor device of claim 1, further comprising:
a plurality of interconnection lines disposed below the lower substrate; and
a lower penetration via penetrating the lower substrate,
wherein at least one of the lower conductive lines is connected to at least one of the interconnection lines through the lower penetration via.

11. The three-dimensional semiconductor device of claim 1, wherein each of the upper transistors further comprises an ohmic contact disposed on the upper gate electrode.

12. A three-dimensional semiconductor device, comprising:
a lower substrate;
a plurality of lower transistors disposed on the lower substrate;
an upper substrate disposed on the lower transistors;
a lower interlayer insulating layer disposed between the lower transistors and the upper substrate;
an upper interlayer insulating layer disposed on the upper substrate;
a plurality of lower conductive lines disposed within the lower interlayer insulating layer between the lower transistors and the upper substrate;
a plurality of upper transistors disposed within the upper interlayer insulating layer on the upper substrate;
a plurality of upper conductive lines disposed on the upper transistors;
an upper penetration via penetrating the upper interlayer insulating layer, the upper substrate, and a portion of the lower interlayer insulating layer,
wherein a first location where an inner side of the upper penetration via and the upper interlayer insulating layer contact each other, a second location where the inner side of the upper penetration via and the upper substrate contact each other, and a third location where the inner side of the upper penetration via and the lower interlayer insulating layer contact each other are vertically aligned; and
a plurality of intermediate transistors disposed within the lower interlayer insulating layer below the upper substrate,
wherein each of the upper transistors comprises:
an upper gate electrode disposed on the upper substrate;
a first upper source/drain pattern disposed in the upper substrate at a first side of the upper gate electrode; and
a second upper source/drain pattern disposed in the upper substrate at a second, opposing side of the upper gate electrode,
wherein each of the lower transistors comprises:
a lower gate electrode disposed on the lower substrate;
a first lower source/drain pattern disposed in the lower substrate at a first side of the lower gate electrode; and
a second lower source/drain pattern disposed in the lower substrate at a second, opposing side of the lower gate electrode,
wherein the upper gate electrode comprises a polycrystalline silicon germanium (SiGe) layer that is doped with a dopant, and a concentration of the dopant in the upper gate electrode is smaller than a concentration of germanium (Ge) in the upper gate electrode,
wherein the lower gate electrode comprises polycrystalline silicon or polycrystalline germanium,
wherein one terminal of at least one of the lower transistors is directly connected to a corresponding one of the lower conductive lines by a lower conductive contact, and one terminal of at least one of the upper transistors is directly connected to a corresponding one of the upper conductive lines by an upper conductive contact,
wherein the one terminal of the at least one of the lower transistors is electrically connected to the one terminal of the at least one of the upper transistors through corresponding ones of the lower conductive lines, the upper and lower conductive contacts, and corresponding ones of the upper conductive lines,
wherein the upper penetration via extends above the upper substrate and is disposed adjacent to the upper gate electrode of at least one of the upper transistors above the upper substrate,
wherein each of the plurality of intermediate transistors comprises:
a back-gate electrode disposed on a bottom surface of the upper substrate; and
a back-gate insulating layer interposed between the upper substrate and the back-gate electrode.

13. The three-dimensional semiconductor device of claim 12, wherein the upper substrate comprises a channel region disposed below the upper gate electrode, and the channel region comprises silicon.

14. The three-dimensional semiconductor device of claim 12, wherein each of the upper transistors comprises an upper gate insulating pattern interposed between the upper substrate and the upper gate electrode.

15. The three-dimensional semiconductor device of claim 12,
wherein at least one of the lower conductive lines is connected to at least one of the upper conductive lines through the upper penetration via.

16. The three-dimensional semiconductor device of claim 15, further comprising:
a plurality of interconnection lines disposed below the lower substrate; and
a lower penetration via penetrating the lower substrate, wherein at least one of the lower conductive lines is connected to at least one of the interconnection lines through the lower penetration via.

\* \* \* \* \*